US012580030B2

(12) United States Patent
Wang et al.

(10) Patent No.: US 12,580,030 B2
(45) Date of Patent: Mar. 17, 2026

(54) DYNAMIC BIT LINE VOLTAGE DURING PROGRAM VERIFY TO PROVIDE MORE THRESHOLD VOLTAGE BUDGET

(71) Applicant: Sandisk Technologies, Inc., Milpitas, CA (US)

(72) Inventors: Ming Wang, Shanghai (CN); Xuan Tian, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 175 days.

(21) Appl. No.: 18/390,824

(22) Filed: Dec. 20, 2023

(65) Prior Publication Data

US 2025/0210118 A1     Jun. 26, 2025

(51) Int. Cl.
*G11C 16/34*        (2006.01)
*G11C 16/04*        (2006.01)
*G11C 16/08*        (2006.01)
*G11C 16/24*        (2006.01)

(52) U.S. Cl.
CPC ...... *G11C 16/3459* (2013.01); *G11C 16/0433* (2013.01); *G11C 16/08* (2013.01); *G11C 16/24* (2013.01)

(58) Field of Classification Search
CPC . G11C 16/3459; G11C 16/0433; G11C 16/08; G11C 16/24

USPC ...................................................... 365/185.22
See application file for complete search history.

(56)                 References Cited

U.S. PATENT DOCUMENTS

| | | | |
|---|---|---|---|
| 10,706,941 | B1 | 7/2020 | Lu et al. |
| 11,081,195 | B2 | 8/2021 | Yang |
| 11,139,031 | B1 | 10/2021 | Chen et al. |
| 11,342,033 | B1 | 5/2022 | Song et al. |
| 2021/0383876 | A1* | 12/2021 | Vali ......................... G11C 16/26 |
| 2021/0391012 | A1 | 12/2021 | Masuduzzaman et al. |
| 2023/0317174 | A1* | 10/2023 | Wang ..................... G11C 16/32 |
| | | | 365/185.23 |
| 2024/0272796 | A1* | 8/2024 | Jia .......................... G06F 3/0679 |

* cited by examiner

*Primary Examiner* — Amir Zarabian
*Assistant Examiner* — Daniel John King
(74) *Attorney, Agent, or Firm* — Dickinson Wright PLLC

(57)                 ABSTRACT
A memory apparatus is provided and includes memory cells connected to word lines and coupled to bit lines and configured to retain a threshold voltage corresponding to data states. A control means determines ones of the data states for a first set of the memory cells connected to a selected word line and for a second set of the memory cells connected to at least one neighboring word line. The control means determines which of a plurality of state groups the memory cells of the first and second sets belong according to the data states determined. The control means determines which one of a plurality of bit line voltage biases to be applied to the bit lines coupled to the memory cells of the first set during a verify operation based on a comparison of state groups of the memory cells of the first set and the second set.

20 Claims, 21 Drawing Sheets

329    300              310              320

302              312              322              324

304              314              321

305              315              325              328

306              316              326              CH

330    SGS, 331    300    333              334    335    SGD, 336

328

$V_{CH}$              302

305              304 sd1    sd2    sd3    sd4    sd5    sd6    sd7    357

356

355

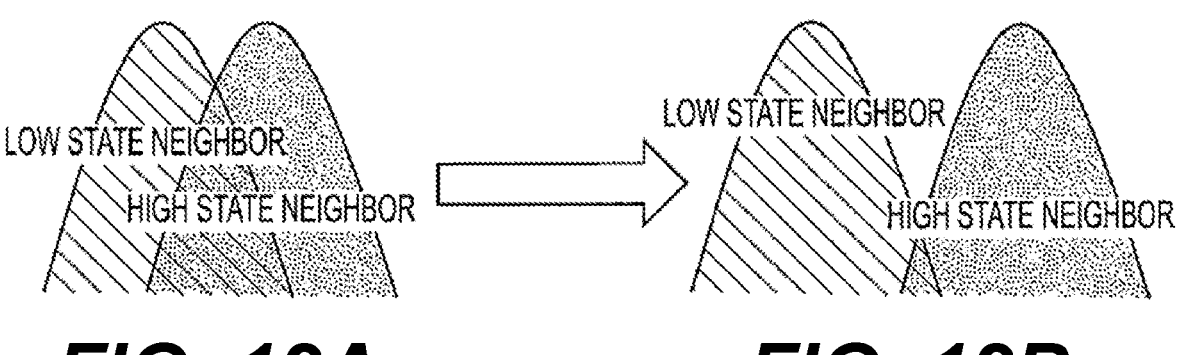
FIG. 12A                FIG. 12B
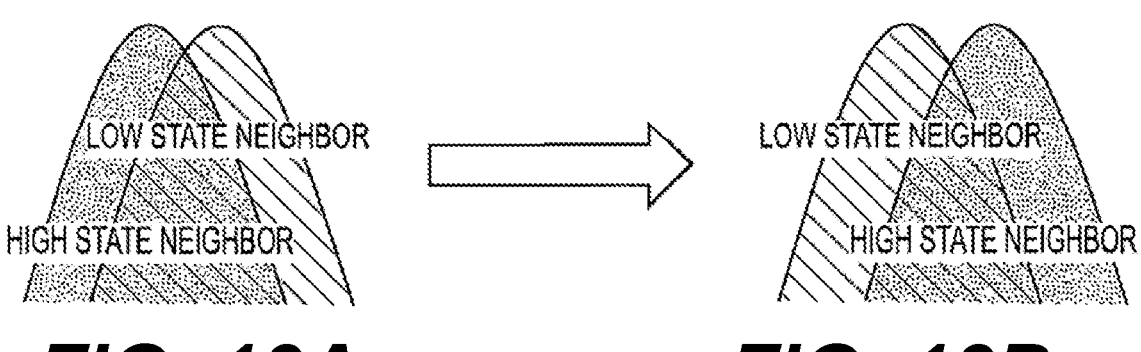
FIG. 13A                FIG. 13B

FIG. 15

| BL BIAS WLn-1 \ WLn | Er | A | B | C | D | E | F | G |
|---|---|---|---|---|---|---|---|---|
| A | VBL1 | VBL1 | VBL1 | VBL1 | VBL1 | VBL3 | VBL3 | VBL3 |
| B | VBL1 | VBL1 | VBL1 | VBL1 | VBL1 | VBL3 | VBL3 | VBL3 |
| C | VBL1 | VBL1 | VBL1 | VBL1 | VBL1 | VBL3 | VBL3 | VBL3 |
| D | VBL1 | VBL1 | VBL1 | VBL1 | VBL1 | VBL3 | VBL3 | VBL3 |
| E | VBL2 | VBL2 | VBL2 | VBL2 | VBL2 | VBL4 | VBL4 | VBL4 |
| F | VBL2 | VBL2 | VBL2 | VBL2 | VBL2 | VBL4 | VBL4 | VBL4 |
| G | VBL2 | VBL2 | VBL2 | VBL2 | VBL2 | VBL4 | VBL4 | VBL4 |

| WLn-1 STATE | LOWER | HIGHER | LOWER | LOWER | LOWER | HIGHER | HIGHER | HIGHER |
|---|---|---|---|---|---|---|---|---|
| WLn+1 STATE | LOWER | LOWER | HIGHER | LOWER | HIGHER | LOWER | HIGHER | HIGHER |
| WLn STATE | LOWER | LOWER | LOWER | HIGHER | HIGHER | HIGHER | LOWER | HIGHER |
| VBL DURING WLn VERIFY | VBL_1 | VBL_2 | VBL_3 | VBL_4 | VBL_5 | VBL_6 | VBL_7 | VBL_8 |

*FIG. 17*

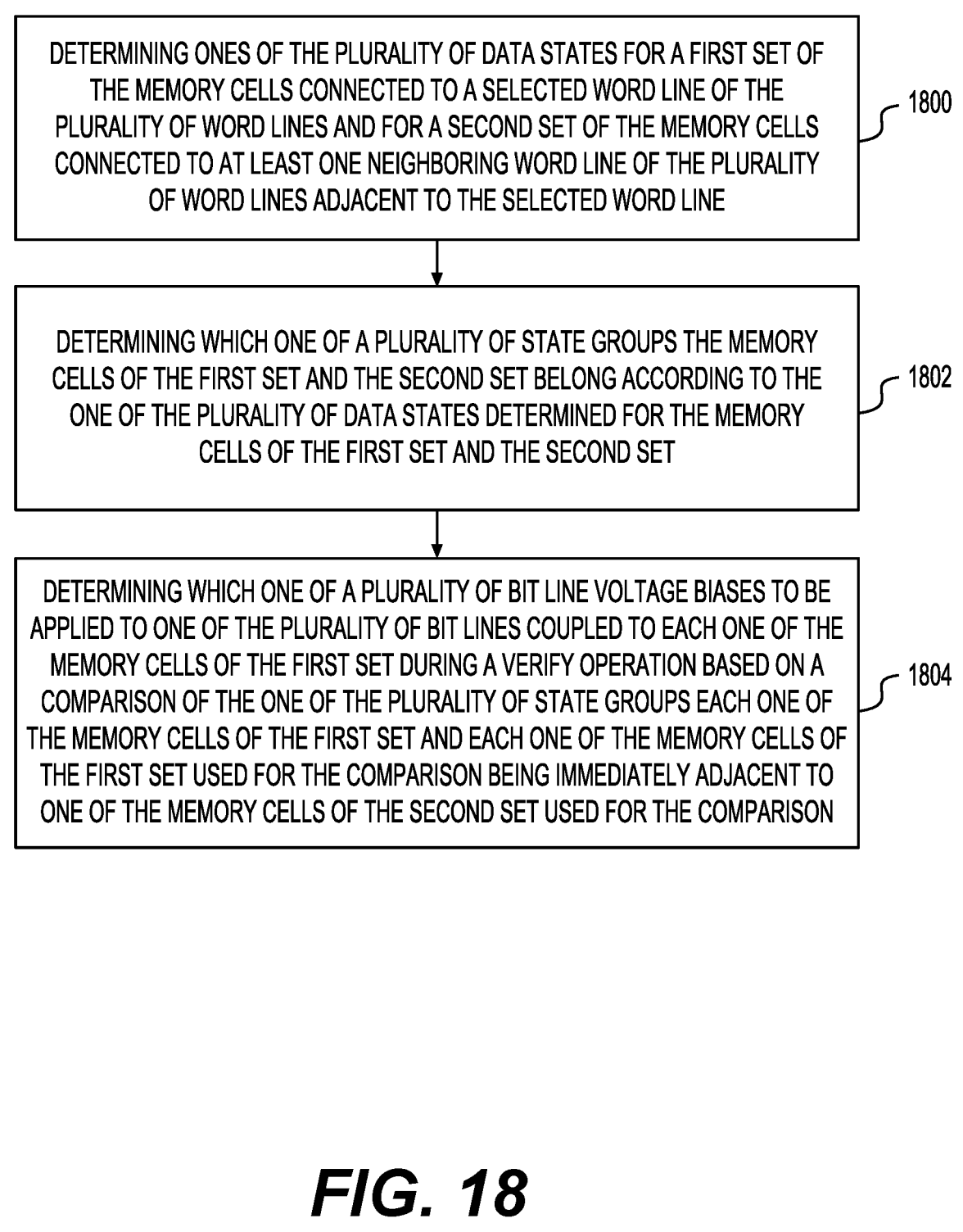

DETERMINING ONES OF THE PLURALITY OF DATA STATES FOR A FIRST SET OF THE MEMORY CELLS CONNECTED TO A SELECTED WORD LINE OF THE PLURALITY OF WORD LINES AND FOR A SECOND SET OF THE MEMORY CELLS CONNECTED TO AT LEAST ONE NEIGHBORING WORD LINE OF THE PLURALITY OF WORD LINES ADJACENT TO THE SELECTED WORD LINE — 1800

DETERMINING WHICH ONE OF A PLURALITY OF STATE GROUPS THE MEMORY CELLS OF THE FIRST SET AND THE SECOND SET BELONG ACCORDING TO THE ONE OF THE PLURALITY OF DATA STATES DETERMINED FOR THE MEMORY CELLS OF THE FIRST SET AND THE SECOND SET — 1802

DETERMINING WHICH ONE OF A PLURALITY OF BIT LINE VOLTAGE BIASES TO BE APPLIED TO ONE OF THE PLURALITY OF BIT LINES COUPLED TO EACH ONE OF THE MEMORY CELLS OF THE FIRST SET DURING A VERIFY OPERATION BASED ON A COMPARISON OF THE ONE OF THE PLURALITY OF STATE GROUPS EACH ONE OF THE MEMORY CELLS OF THE FIRST SET AND EACH ONE OF THE MEMORY CELLS OF THE FIRST SET USED FOR THE COMPARISON BEING IMMEDIATELY ADJACENT TO ONE OF THE MEMORY CELLS OF THE SECOND SET USED FOR THE COMPARISON — 1804

*FIG. 18*

DYNAMIC BIT LINE VOLTAGE DURING PROGRAM VERIFY TO PROVIDE MORE THRESHOLD VOLTAGE BUDGET

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein.

Accordingly, it is an aspect of the present disclosure to provide a memory apparatus including memory cells connected to a plurality of word lines and disposed in memory holes each connected to one of a plurality of bit lines, the memory cells configured to retain a threshold voltage corresponding to one of a plurality of data states. The memory apparatus also includes a control means coupled to the plurality of word lines and the plurality of bit lines. The control means is configured to determine ones of the plurality of data states for a first set of the memory cells connected to a selected word line of the plurality of word lines and for a second set of the memory cells connected to at least one neighboring word line of the plurality of word lines adjacent to the selected word line. The control means determines which one of a plurality of state groups the memory cells of the first set and the second set belong according to the ones of the plurality of data states determined for the memory cells of the first set and the second set. The control means is also configured to determine which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong. The one of the memory cells of the first set used for the comparison is immediately adjacent to one of the memory cells of the second set used for the comparison.

According to another aspect of the disclosure, a controller in communication with a memory apparatus including memory cells connected to a plurality of word lines is provided. The memory cells are disposed in memory holes each connected to one of a plurality of bit lines and are configured to retain a threshold voltage corresponding to one of a plurality of data states. The controller is configured to instruct the memory apparatus to determine ones of the plurality of data states for a first set of the memory cells connected to a selected word line of the plurality of word lines and for a second set of the memory cells connected to at least one neighboring word line of the plurality of word lines adjacent to the selected word line. The controller is additionally configured to determine which one of a plurality of state groups the memory cells of the first set and the second set belong according to the ones of the plurality of data states determined for the memory cells of the first set and the second set. The controller is also configured to determine which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong. The one of the memory cells of the first set used for the comparison is immediately adjacent to one of the memory cells of the second set used for the comparison.

According to an additional aspect of the disclosure, a method of operating a memory apparatus is provided. The memory apparatus includes memory cells connected to a plurality of word lines is provided. The memory cells are disposed in memory holes each connected to one of a plurality of bit lines and are configured to retain a threshold voltage corresponding to one of a plurality of data states. The method includes the step of determining ones of the plurality of data states for a first set of the memory cells connected to a selected word line of the plurality of word lines and for a second set of the memory cells connected to at least one neighboring word line of the plurality of word lines adjacent to the selected word line. The method continues with the step of determining which one of a plurality of state groups the memory cells of the first set and the second set belong according to the ones of the plurality of data states determined for the memory cells of the first set and the second set. The method also includes the step of determining which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong. The one of the memory cells of the first set used for the comparison is immediately adjacent to one of the memory cells of the second set used for the comparison.

Further areas of applicability will become apparent from the description provided herein. The description and specific examples in this summary are intended for purposes of illustration only and are not intended to limit the scope of the present disclosure.

DRAWINGS

For a detailed description of example embodiments, reference will now be made to the accompanying drawings in which:

FIGS. 12A and 12B illustrate example graphical representations of Vth distributions of a data state after program disturb (PD) and data retention (DR), respectively according to aspects of the disclosure;

Figure 14A:
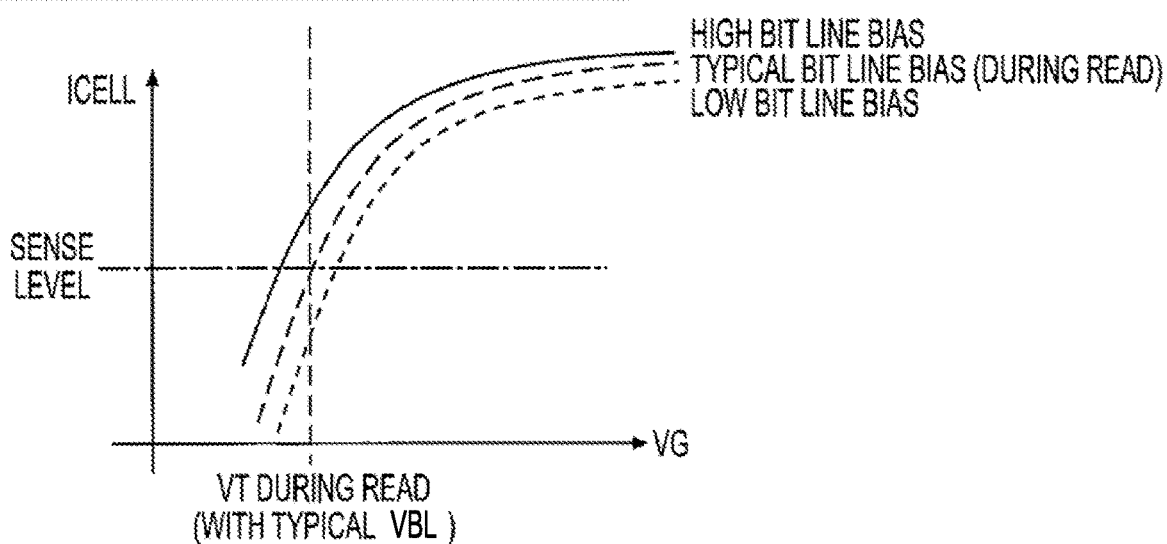
Figure 14B:
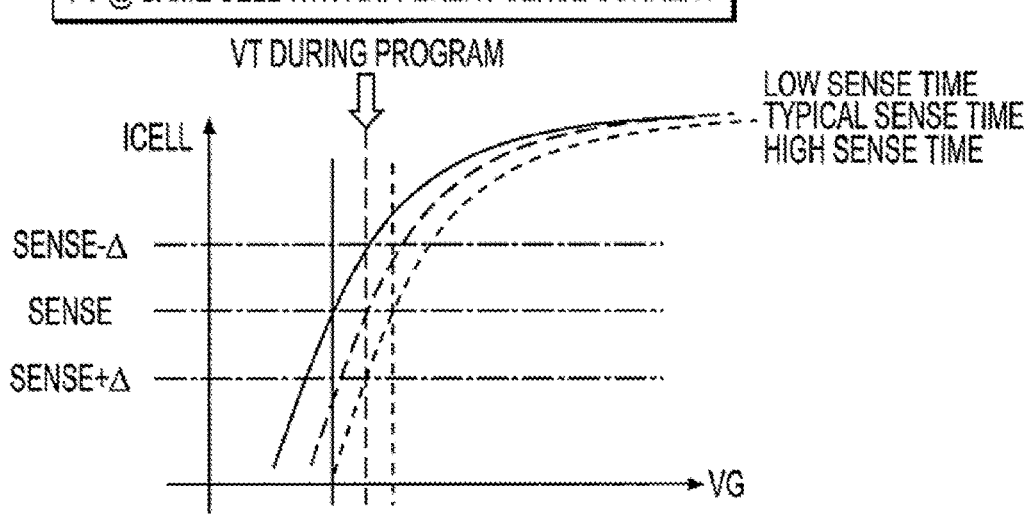
Figure 16:
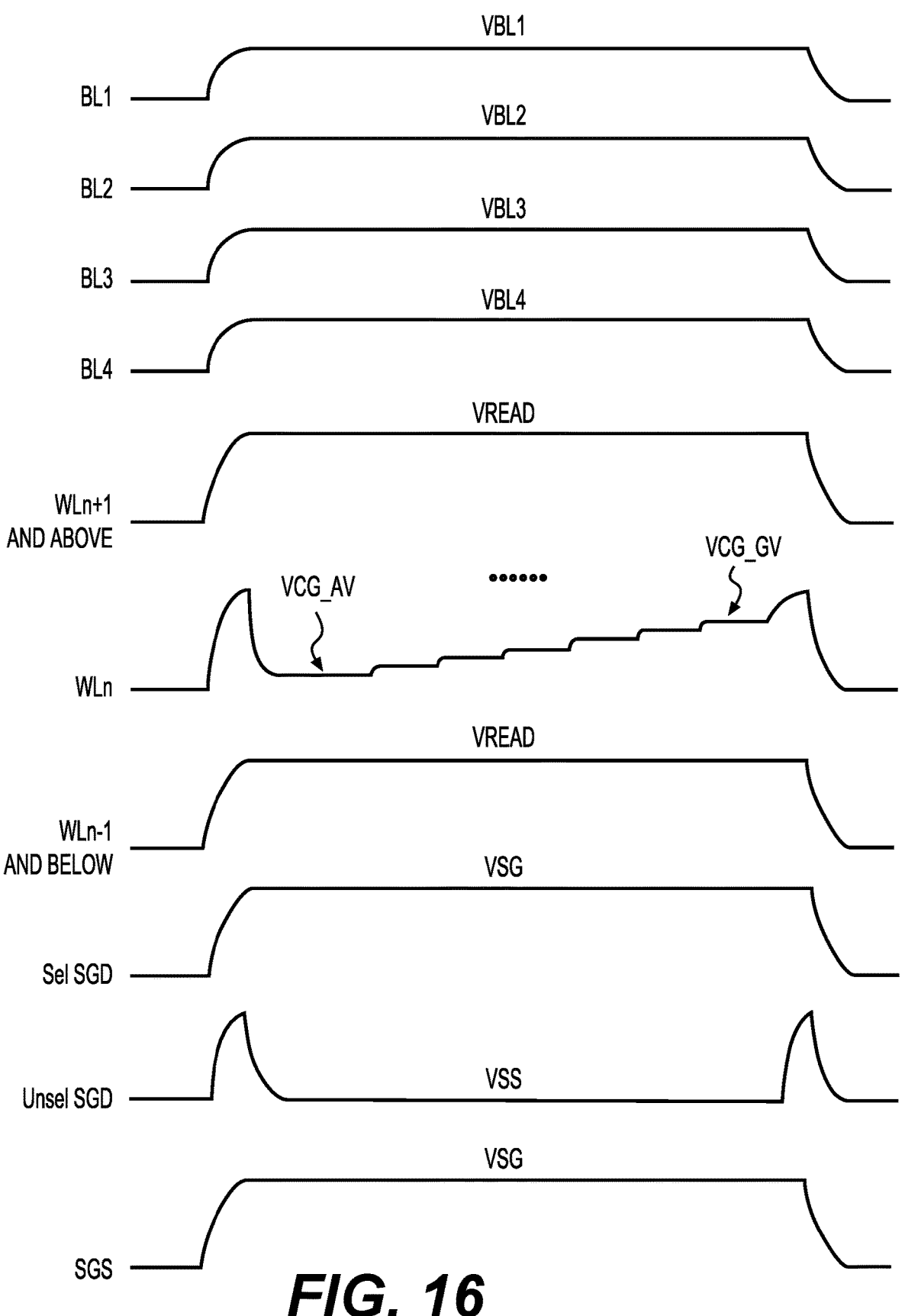

FIGS. 13A and 13B provides example graphical representations of Vth distributions of a data state illustrating compensation for neighboring word line interference (NWI) after PD and DR, respectively according to aspects of the disclosure;

FIGS. 14A and 14B depicts a current-voltage characteristic for a memory cell during a program-verify operation using bit line bias (VBL) and sense level adjustment according to aspects of the disclosure;

FIG. 15 is a chart showing example bit line biases for a selection of data states for the lower state group and the higher state group as described above and various possible cases of comparisons between the data state groups of the memory cells of the first set and the second set using the data state of only the second neighboring word line according to aspects of the disclosure;

FIG. 16 is an example timing chart of various voltages applied to the bit lines, word lines, selected drain-side select gate transistor, unselected drain-side transistor select gate, and source-side select gate transistor of the memory apparatus during the verify operation according to aspects of the disclosure;

FIG. 17 is a chart showing example bit line biases for various possible cases of comparisons between the data state groups of the memory cells of the first set and the second set using the data states of both the first and second neighboring word lines according to aspects of the disclosure; and FIG. 18 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Figures 9, 10, 11:
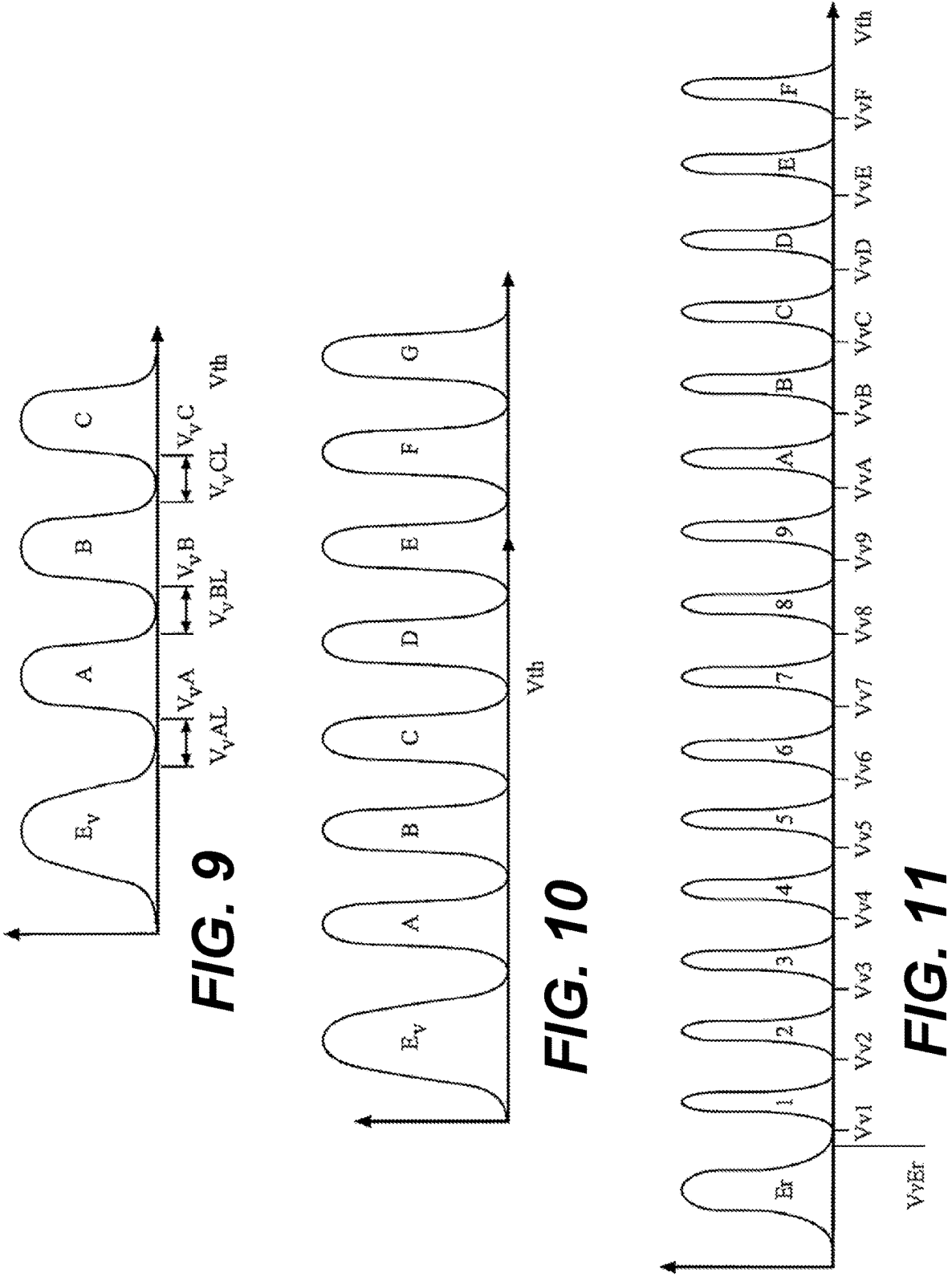
FIG. 9 depicts the Vth distributions of memory cells in an example one-pass programming operation with four data states according to aspects of the disclosure.
FIG. 10 depicts the Vth distributions of memory cells in an example one-pass programming operation with eight data states according to aspects of the disclosure.
FIG. 11 depicts the Vth distributions of memory cells in an example one-pass programming operation with eight data states according to aspects of the disclosure.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 9). In a three-bit per cell memory device (triple-level cell (TLC)), there are eight data states including the erased state and seven higher data states referred to as the A, B, C, D, E, F and G data states (see FIG. 10). In a four-bit per cell memory device (quad-level cell (QLC)), there are sixteen data states including the erased state and fifteen higher data states referred to as the Er, 1, 2, 3, 4, 5, 6, 7, 8, 9, A, B, C, D, E and F data states (see FIG. 11). Each memory cell may store a data state (e.g., a binary value) and is programmed to a threshold voltage state corresponding to the data state. Each state represents a different value and is assigned a voltage window including a range of possible threshold voltages.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and may be lower than the final verify voltage. When a memory cell is close to completion of programming, the programming speed of the memory cell may be reduced such as by elevating a voltage of a respective bit line during one or more subsequent program voltages. For example, in FIG. 9, a memory cell which is to be programmed to the A data state may be subject to verify tests at VvAL, an offset verify voltage of the A data state, and VvA, a final verify voltage of the A data state.

However, technological improvements have reduced the size of memory circuitry and related hardware, thereby making it difficult to efficiently program the memory cells. For example, by decreasing the size of memory circuitry and related hardware, more memory cells may be placed within a memory architecture. The silicon oxide and silicon nitride ("ON") pitch shrinking that occurs reduces the amount of physical space between word lines. Consequently, when a memory cell is programmed, neighbor word line interference (NWI) from a neighboring memory cell may impact the program-verify operation, such that additional program-verify iterations are needed to complete programming of the memory cells.

More specifically, the trend of shrinking ON pitch from generation to generation of BiCS NAND has caused the cell effective gate length and word line-word line distance to decrease. As a result, NWI has worsened and the Vth margin has degraded. With conventional full sequence program scheme, the memory cell with a neighboring word line (i.e., WLn+1) in high states has a higher Vth due to the NWI effect and such effect is stronger in narrower ON pitch memory cells. Furthermore, during high temperature data retention (HTDR), Vth shifts down more for those memory cells with low Vth neighbors as compared with memory cells with high Vth neighbors. As such, the Vth distribution further widens after data retention and such effect (because of lateral charge movement) is worse in narrow ON pitch memory cells. Accordingly, neighboring word line compensation to improve HTDR, for example, would be advantageous.

Figures 1A, 1B:
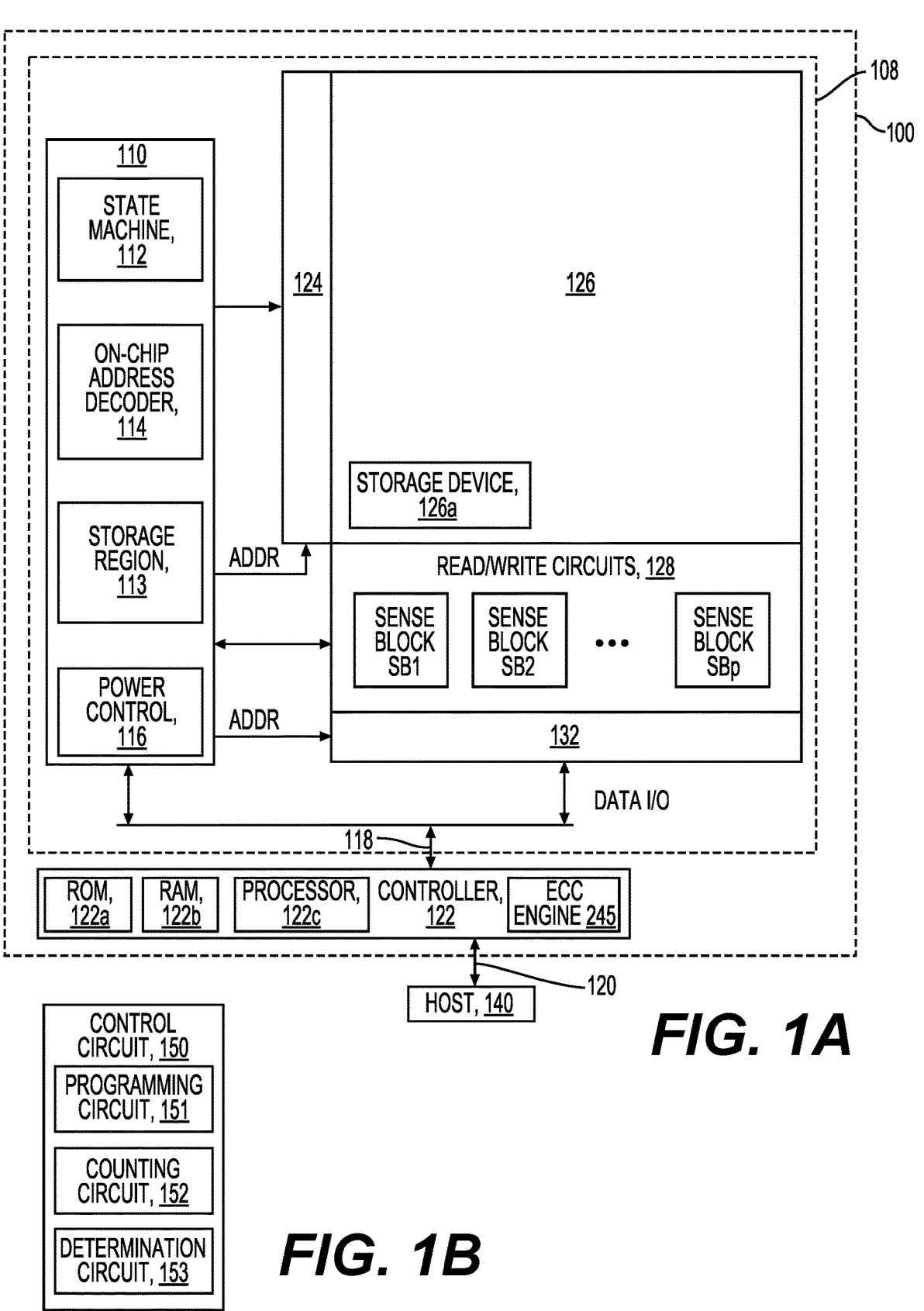
FIG. 1A is a block diagram of an example memory device according to aspects of the disclosure.
FIG. 1B is a block diagram of an example control circuit which comprises a programming circuit, a counting circuit, and a determination circuit according to aspects of the disclosure.

FIG. 1A will now be described. FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

For example, FIG. 1B is a block diagram of an example control circuit 150 which comprises a programming circuit 151, a counting circuit 152 and a determination circuit 153. The programming circuit may include software, firmware and/or hardware. The counting circuit may include software, firmware and/or hardware. The determination circuit may include software, firmware and/or hardware.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
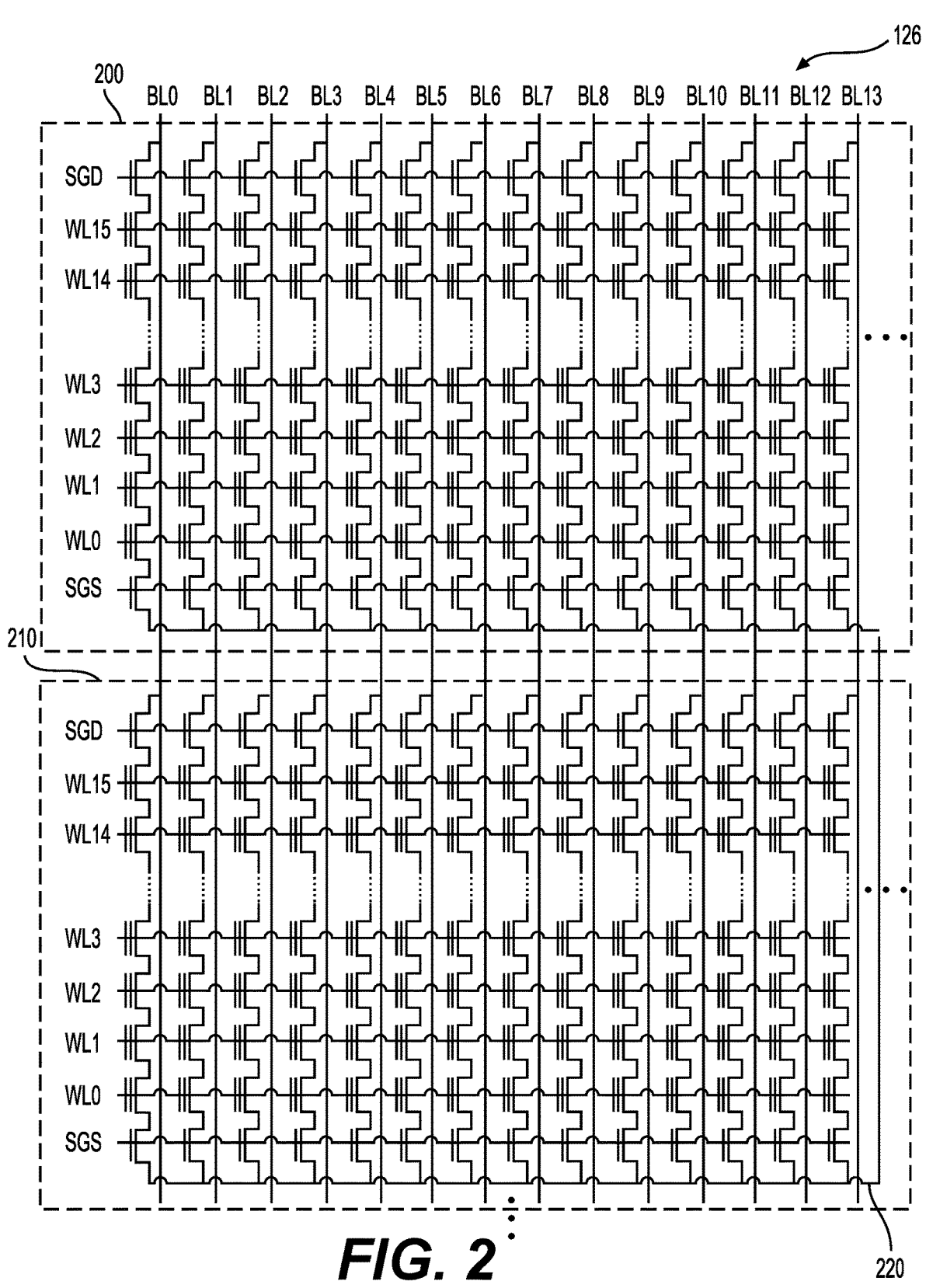
FIG. 2 depicts blocks of memory cells in an example two-dimensional configuration of the memory array of FIG. 1A according to aspects of the disclosure.

FIG. 2 depicts blocks of memory cells in an example two-dimensional configuration of the memory array 126 of FIG. 1A. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
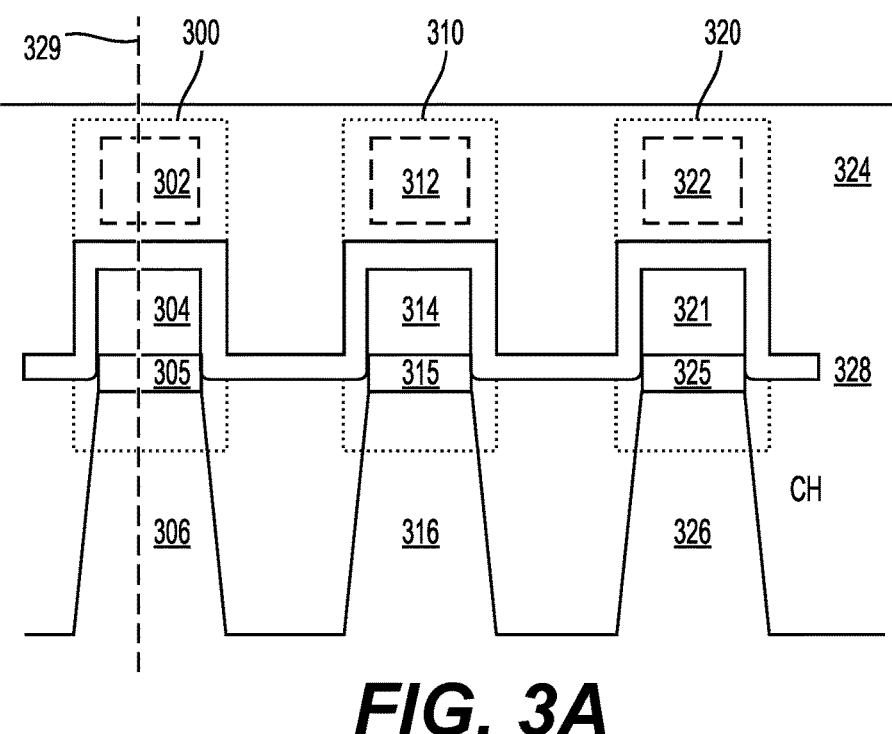
FIG. 3A depicts a cross-sectional view of example floating gate memory cells in NAND strings according to aspects of the disclosure.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
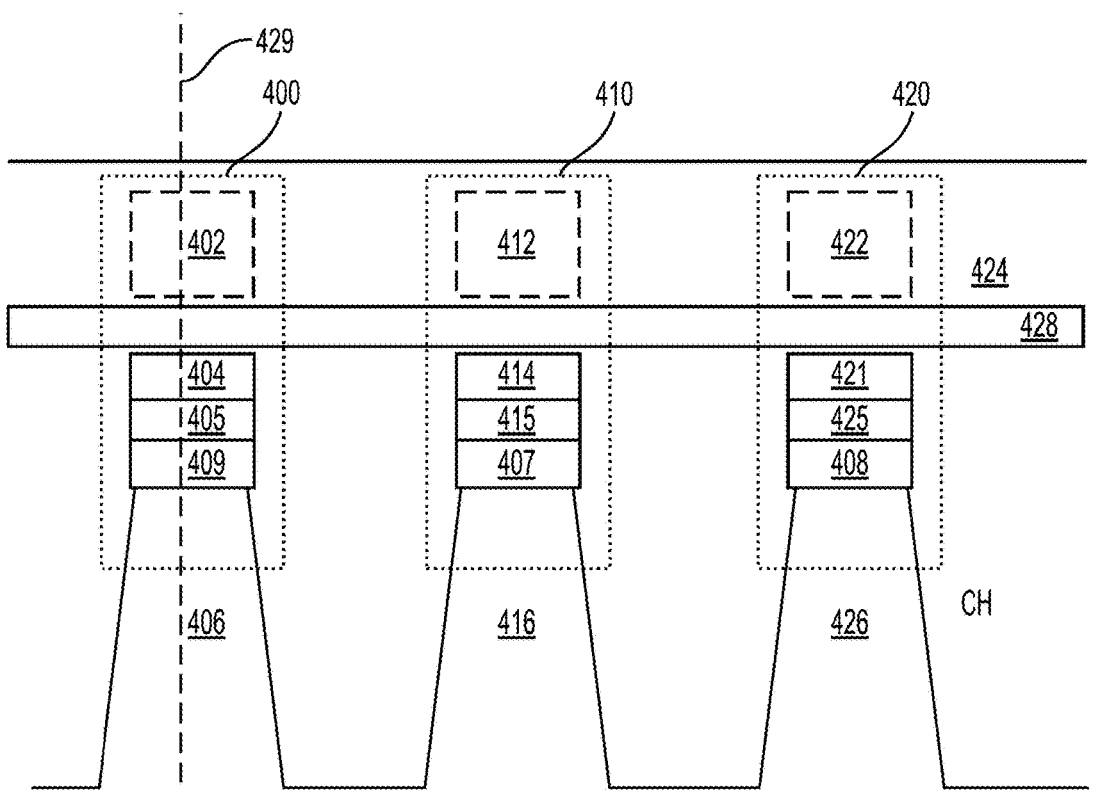
FIG. 4A depicts a cross-sectional view of example charge-trapping memory cells in NAND strings according to aspects of the disclosure.
Figure 4B:
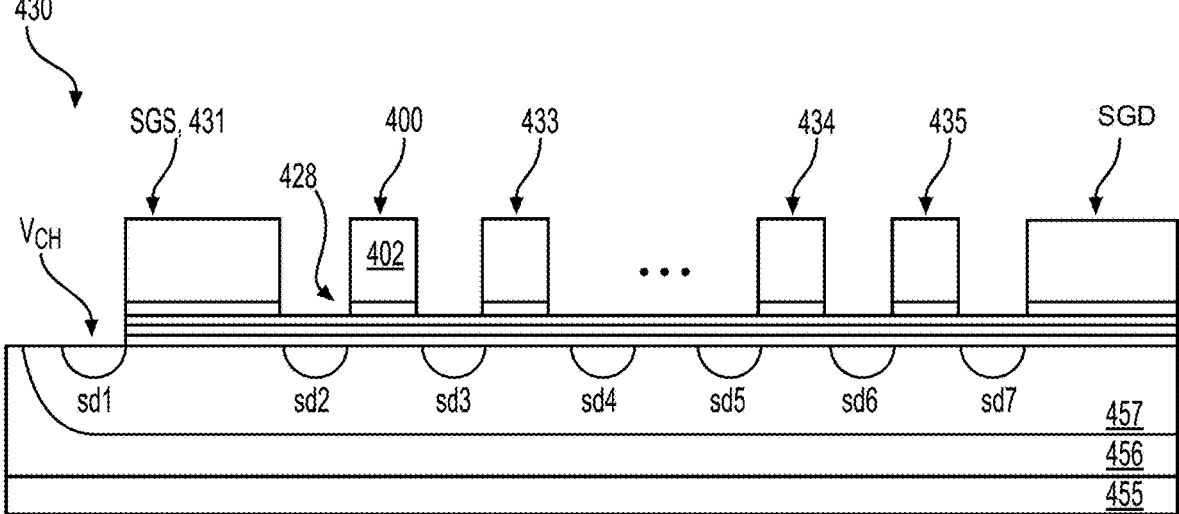
FIG. 4B depicts a cross-sectional view of the structure of FIG. 4A along line 429 according to aspects of the disclosure.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
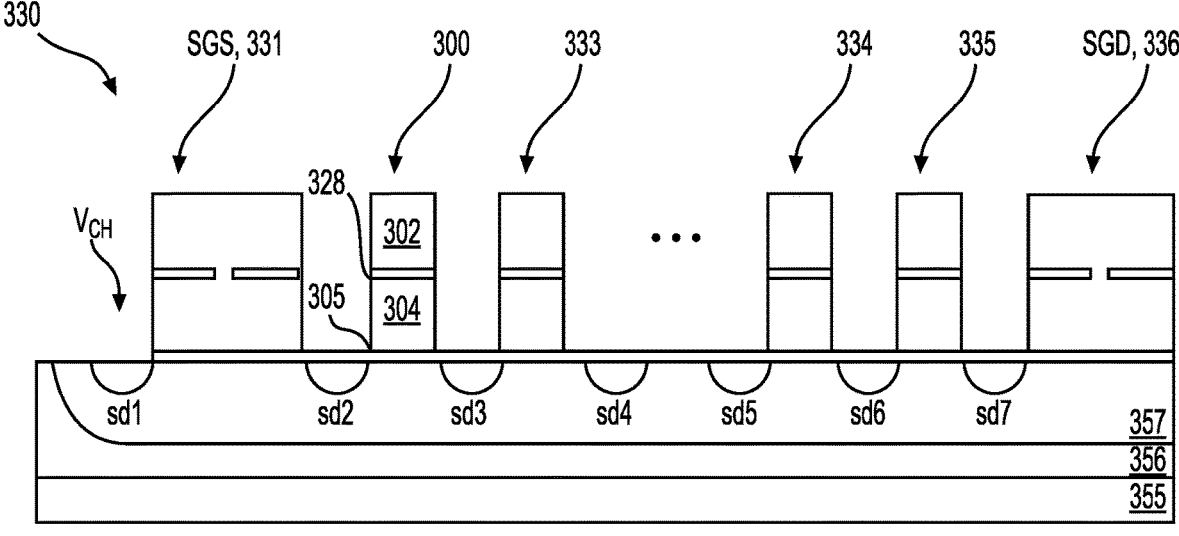
FIG. 3B depicts a cross-sectional view of the structure of FIG. 3A along line 329 according to aspects of the disclosure.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1A. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
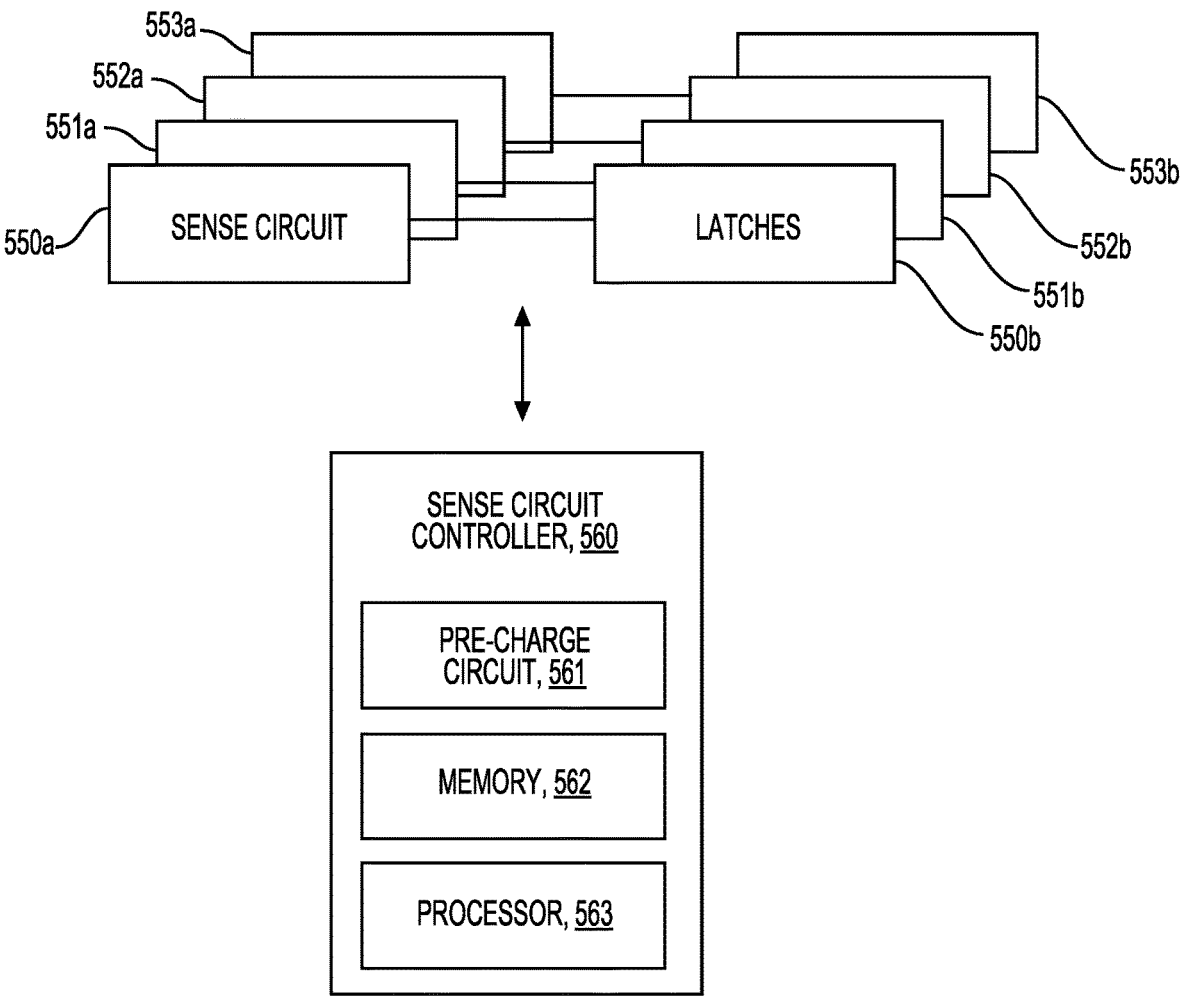
FIG. 5A depicts an example block diagram of the sense block SB1 of FIG. 1A according to aspects of the disclosure.

FIG. 5A depicts an example block diagram of the sense block SB1 of FIG. 1A. In one approach, a sense block comprises multiple sense circuits. Each sense circuit is associated with data latches. For example, the example sense circuits 550a, 551a, 552a and 553a are associated with the data latches 550b, 551 b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
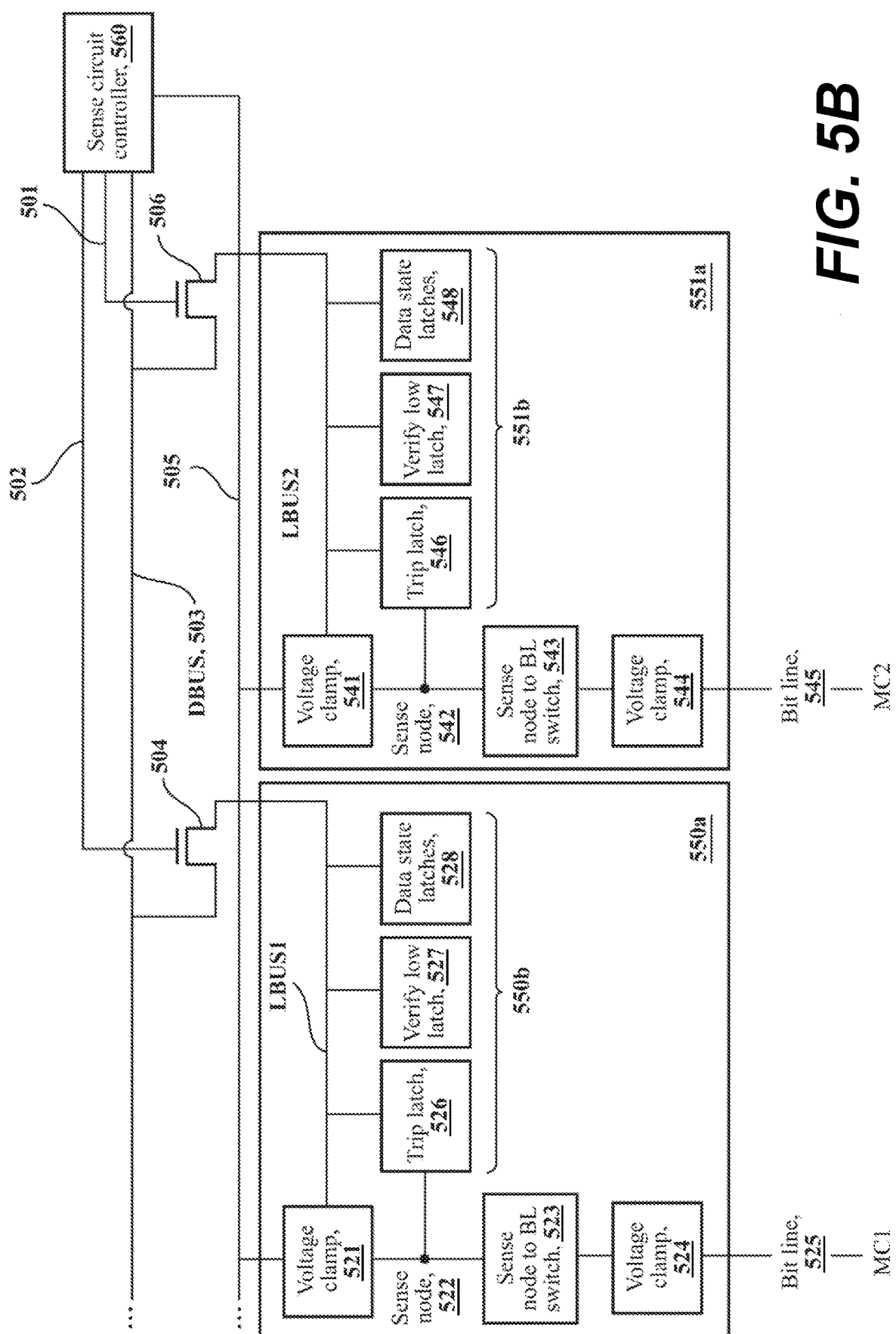
FIG. 5B depicts another example block diagram of the sense block SB1 of FIG. 1A according to aspects of the disclosure.

FIG. 5B depicts another example block diagram of the sense block SB1 of FIG. 1A. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
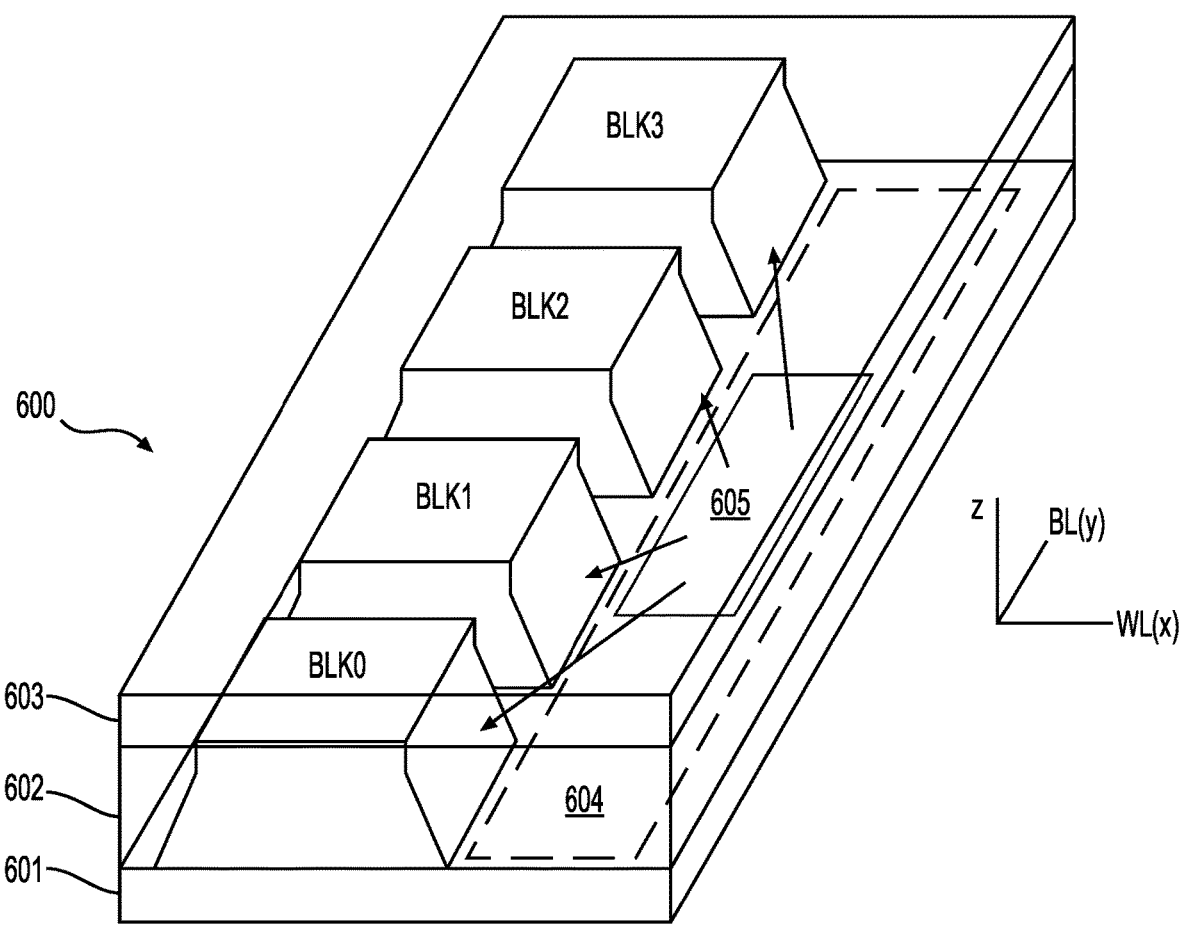
FIG. 6A is a perspective view of a set of blocks in an example three-dimensional configuration of the memory array of FIG. 1A according to aspects of the disclosure.

FIG. 6A is a perspective view of a set of blocks 600 in an example three-dimensional configuration of the memory array 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
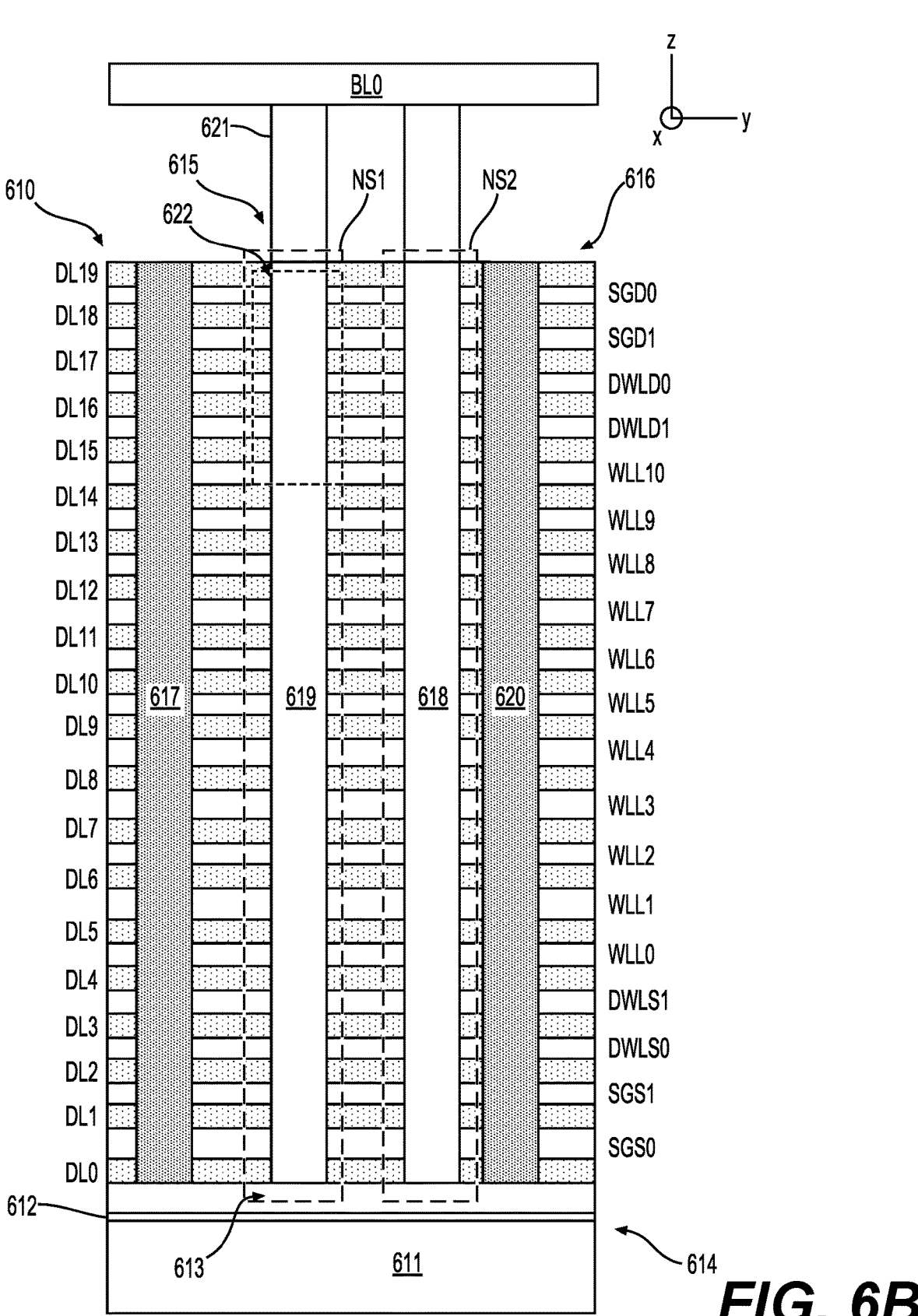
FIG. 6B depicts an example cross-sectional view of a portion of one of the blocks of FIG. 6A according to aspects of the disclosure.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
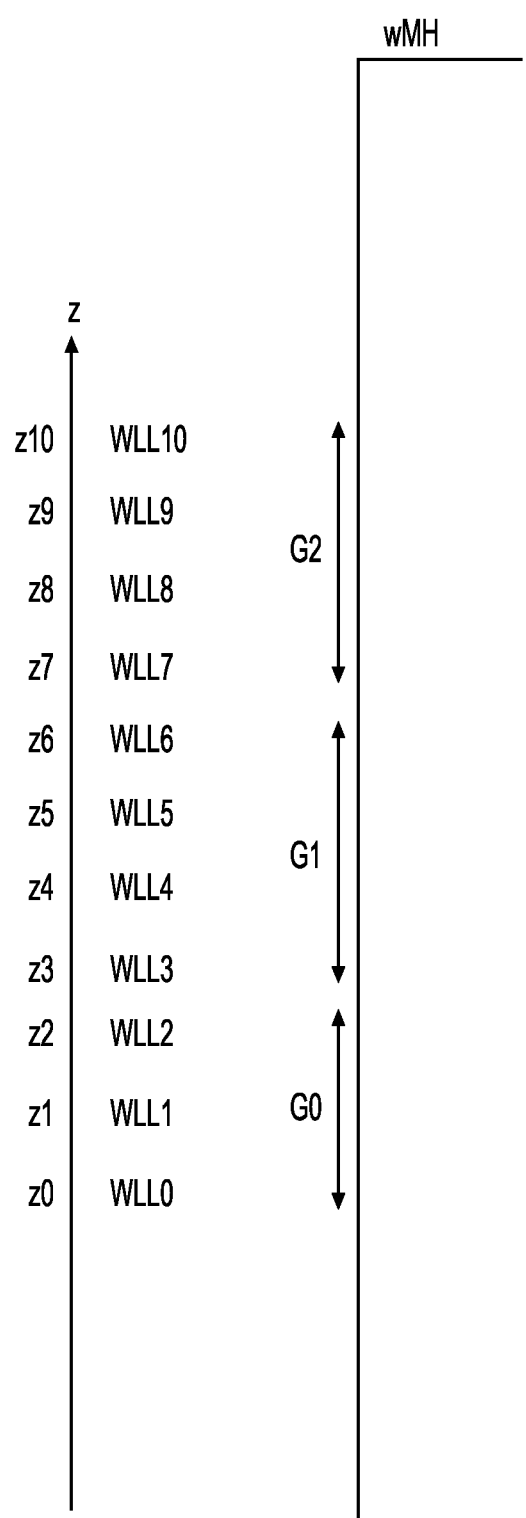
FIG. 6C depicts a plot of memory hole diameter in the stack of FIG. 6B according to aspects of the disclosure.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights $z0$-$z10$ in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
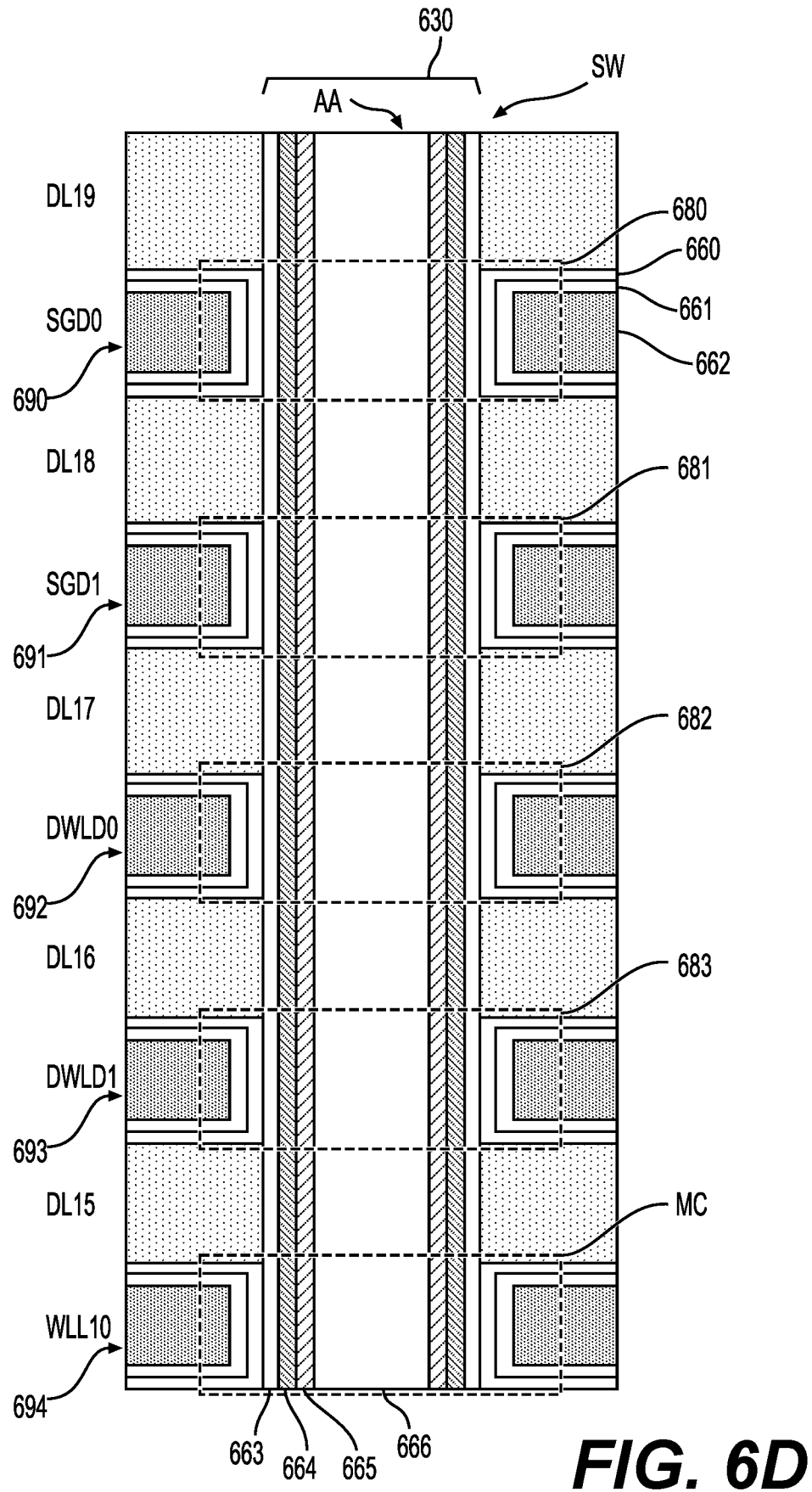
FIG. 6D depicts a close-up view of the region 622 of the stack of FIG. 6B according to aspects of the disclosure.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figures 7A, 7B:
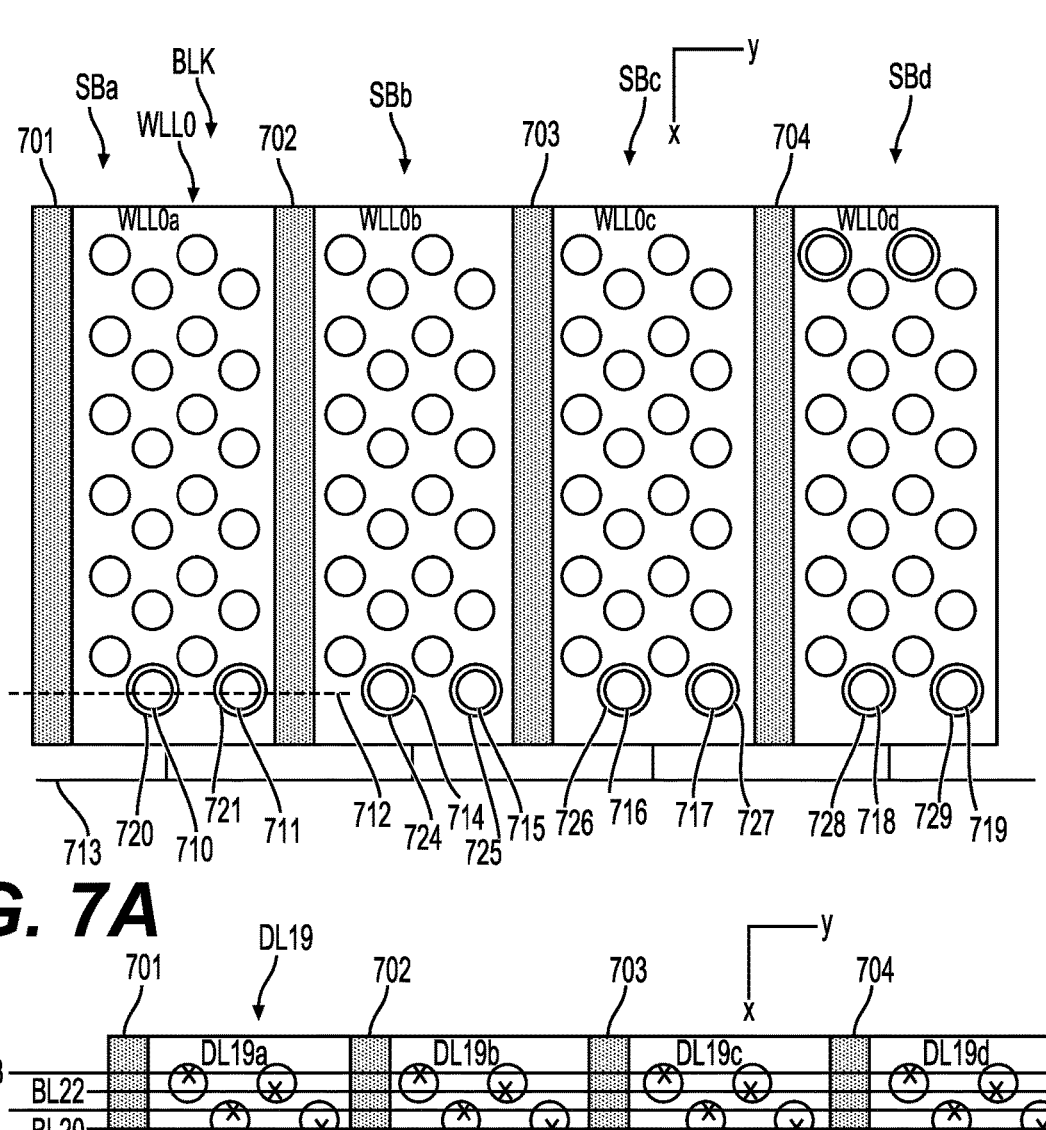
FIG. 7A depicts a top view of an example word line layer WLL0 of the stack of FIG. 6B according to aspects of the disclosure.
FIG. 7B depicts a top view of an example top dielectric layer DL19 of the stack of FIG. 6B according to aspects of the disclosure.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a connector 713. The last region of a word line layer in a block can be connected to a first region of a word line layer in a next block, in one approach. The connector, in turn, is connected to a voltage driver for the word line layer. The region WLL0a has example memory holes 710 and 711 along a line 712. The region WLL0b has example memory holes 714 and 715. The region WLL0c has example memory holes 716 and 717. The region WLL0d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0a, memory cells 724 and 725 are in WLL0b, memory cells 726 and 727 are in WLL0c, and memory cells 728 and 729 are in WLL0d. These memory cells are at a common height in the stack.

Metal-filled slits 701, 702, 703 and 704 (e.g., metal interconnects) may be located between and adjacent to the edges of the regions WLL0a-WLL0d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the –x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
FIG. 8A depicts example NAND strings in the sub-blocks SBa-SBd of FIG. 7A according to aspects of the disclosure.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
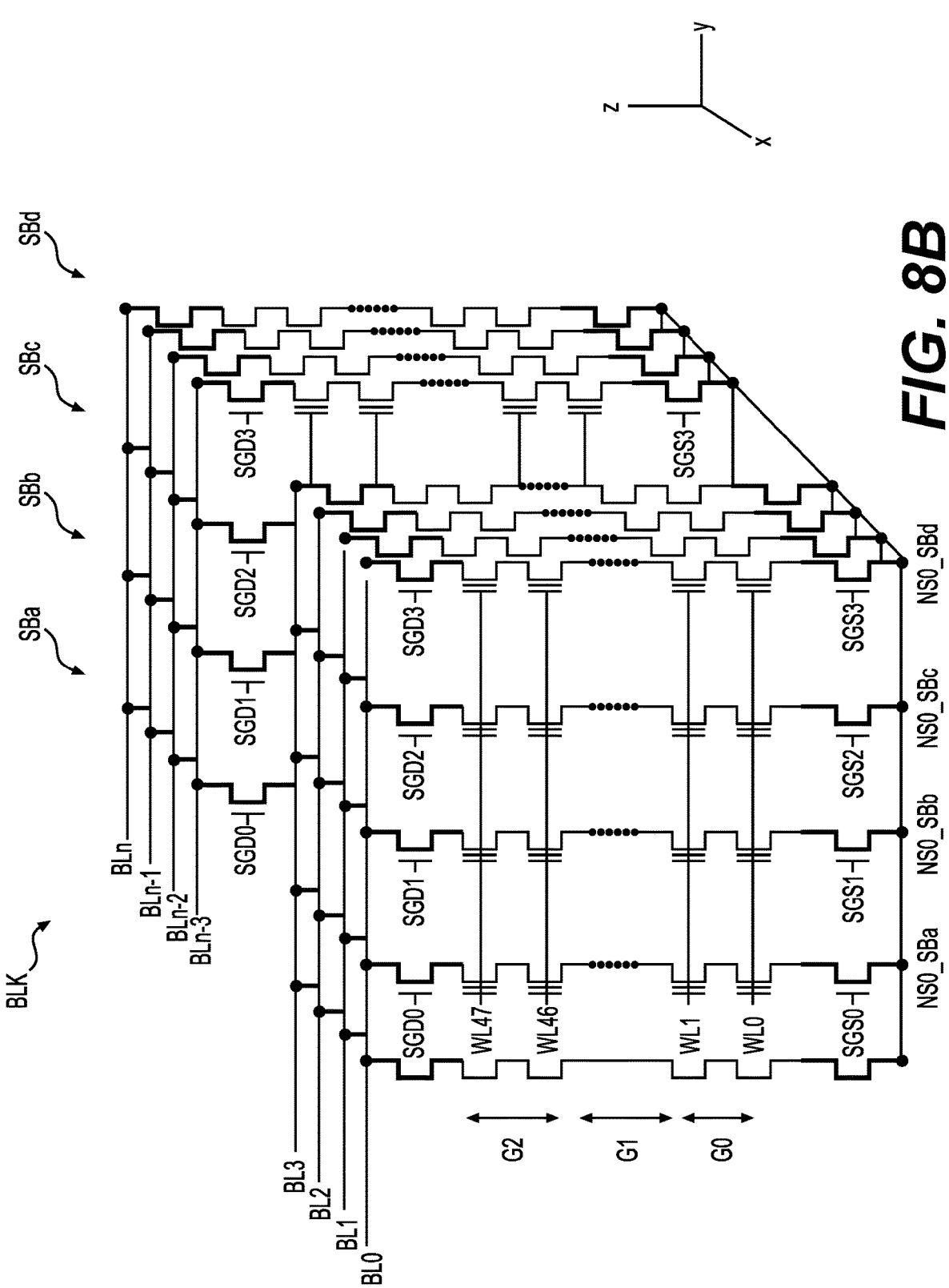
FIG. 8B depicts another example view of NAND strings in sub-blocks according to aspects of the disclosure.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
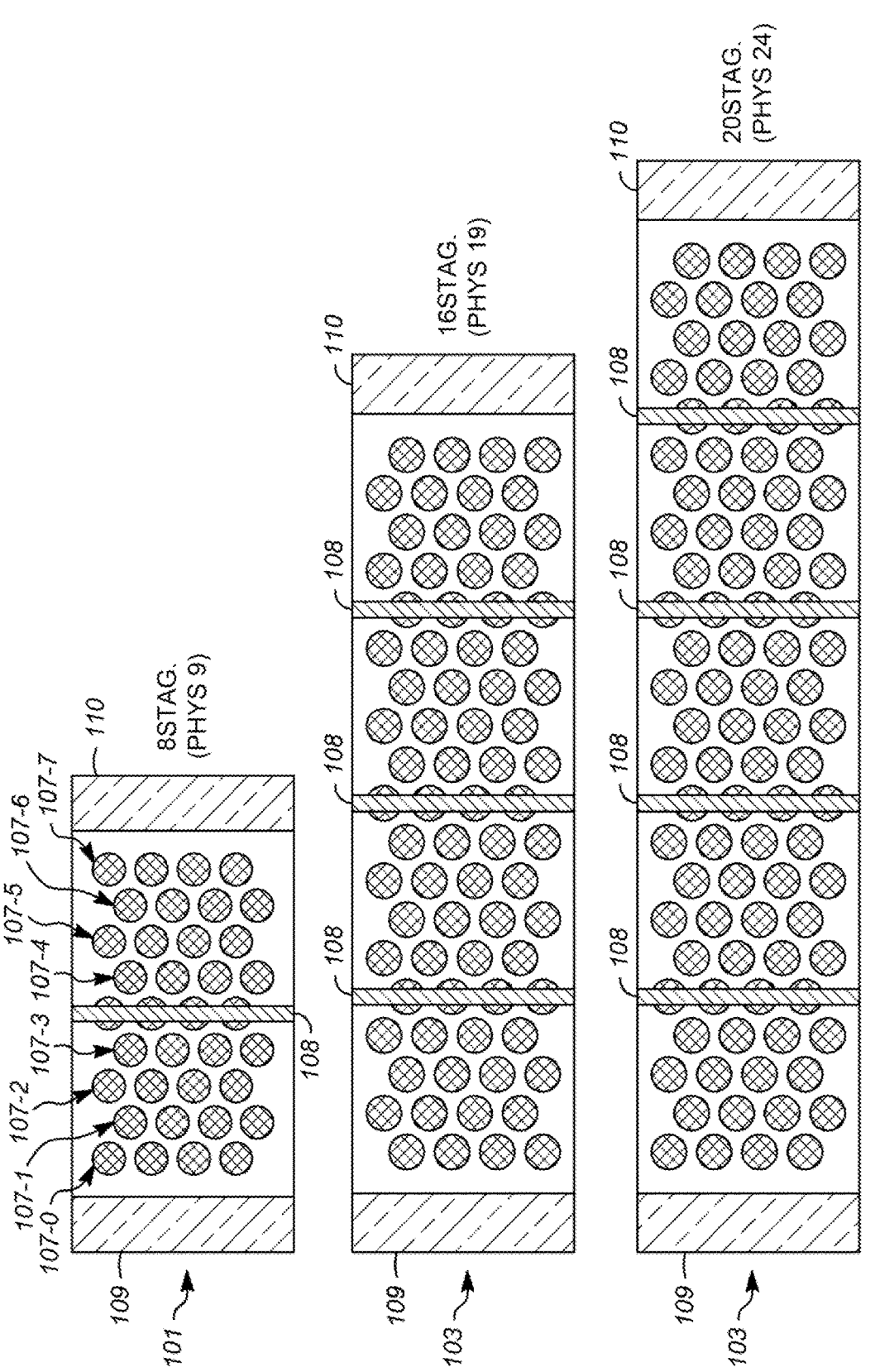
FIG. 8C depicts a top view of example word line layers of a stack according to aspects of the disclosure.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight row. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

To help further illustrate the foregoing, FIGS. 12A and 12B will now be described. FIGS. 12A and 12B illustrate example graphical representations of Vth distributions of a data state after PD and DR, respectively. As described, when a memory cell is programmed, NWI from a neighboring memory cell may cause a Vth distribution to shift and widen. For example, as shown in FIG. 12A, with conventional full sequence programming, after PD, NWI will cause a memory cell with a neighbor (e.g., WLn+1) in high states to have higher Vth and a memory cell with a neighbor in low states to have a lower Vth, thereby widening the Vth distribution of the data state. As shown in FIG. 12B, after HTDR, Vth shifts down even more for memory cells with low state neighbors as compared with memory cells with high state neighbors.

Compensation for NWI caused by memory cells that are neighbors to a memory cell of a selected word line can be achieved by performing a verify operation using adjusted bit line biases, for example. FIGS. 13A and 13B provides example graphical representations of Vth distributions of a data state illustrating this compensation for NWI after PD and DR, respectively. For example, as shown in FIG. 13A, after PD, programming may cause Vth of a memory cell with a neighbor in high states to shift down and Vth of a memory cell with a neighbor in low states to shift up. Moreover, as shown in FIG. 13B, after HTDR, the programming enables for less overall Vth distribution widening after HTDR.

FIGS. 14A and 14B depicts a current-voltage characteristic for a memory cell during a program-verify operation using bit line bias (VBL) and sense level adjustment. As shown in FIG. 14A, using a high bit line bias during the program-verify operation causes Vth for the memory cell to shift up during a read operation, and using a low bit line bias during the program-verify operation causes Vth for the memory cell to shift down during the read operation. As such, in order to compensate for NWI caused by a memory cell that neighbors the memory cell of a selected word line, if the neighboring memory cell is in a high Vth state, a low bit line bias may be used during a program verify operation performed on the word line of the memory cell, in accordance with one or more systems and/or methods described herein. In contrast, if the neighboring memory cell is in a low Vth state, a high bit line bias may be used during a program verify operation performed on the word line of the memory cell, in accordance with one or more systems and/or methods described herein.

As shown in FIG. 14B, using a lower sense time during the program-verify operation causes Vth for the memory cell to shift up during a read operation, and using a higher sense time during the program-verify operation causes Vth for the memory cell to shift up during the read operation. As such, in order to compensate for NWI caused by a memory cell that neighbors the memory cell of a selected word line, if the neighboring memory cell is in a high Vth state, a lower sense time may be used during a program verify operation performed on the word line of the memory cell, in accordance with one or more systems and/or methods described herein.

In contrast, if the neighboring memory cell is in a low Vth state, a higher sense time may be used during a program verify operation performed on the word line of the memory cell.

As mentioned above, neighboring word line compensation to improve HTDR, for example, would be advantageous. Specifically, there is a need to improve lateral HTDR and reduce read retry ratio of HTDR. Indeed, Direct Look Ahead (DLA) is a widely used device mode which benefits HTDR with lateral charge loss/gain. However, it is used for read operations instead of program-verify or verify operations and it increases operation time (i.e., read time tRead) and can significantly impact device performance.

Consequently, described herein is a memory apparatus (e.g., memory device 100 of FIG. 1A) including memory cells (e.g., memory cells MC1, MC2 of FIG. 5B data memory cell MC of FIG. 6D) connected to a plurality of word lines (e.g., WLL10 of FIG. 6D) and disposed in memory holes (e.g., NAND strings NS1 and NS2 of FIG. 6B or NS1 or memory hole 630 of FIG. 6D) each connected to one of a plurality of bit lines (e.g., bit line BL0 of FIG. 6B). The memory cells are configured to retain a threshold voltage corresponding to one of a plurality of data states (e.g., erased state and A. B, C data states of FIG. 9, the erased state and A, B, C, D, E, F and G data states of FIG. 10, the erased state and 1, 2, 3, 4, 5, 6, 7, 8, 9, A, B, C, D, E and F data states of FIG. 11). The memory apparatus also includes a control circuit or means (e.g., one or any combination of controller 122 of FIG. 1A, decoders 124, 132, read/write circuits 128, control circuitry 110, sense blocks SB1, SB2, SBp of FIG. 1A, control circuit 150 of FIG. 1B, and so forth) coupled to the plurality of word lines and the plurality of bit lines. The control means is configured to determine ones of the plurality of data states for a first set of the memory cells connected to a selected word line WLn of the plurality of word lines (i.e., the word line being programmed/verified) and for a second set of the memory cells connected to at least one neighboring word line of the plurality of word lines adjacent to the selected word line WLn. The control means is also configured to determine which one of a plurality of state groups the memory cells of the first set and the second set belong according to the ones of the plurality of data states determined for the memory cells of the first set and the second set. The control means determines which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong. The one of the memory cells of the first set used for the comparison is immediately adjacent to one of the memory cells of the second set used for the comparison.

According to an aspect, the plurality of state groups includes a higher state group including ones of the plurality of data states corresponding to the threshold voltage being relatively higher. The plurality of state groups also includes a lower state group including other ones of the plurality of data states corresponding to the threshold voltage being relatively lower compared to the ones of the plurality of data states of the higher state group. According to another aspect, the plurality of bit line voltage biases includes a first single neighbor bit line bias VBL1 and a second single neighbor bit line bias VBL2 and a third single neighbor bit line bias VBL3 and a fourth single neighbor bit line bias VBL4. Thus, the control means is further configured to apply the first single neighbor bit line bias VBL1 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the lower state group. The control means is additionally configured to apply the second single neighbor bit line bias VBL2 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the higher state group. The control means is also configured to apply the third single neighbor bit line bias VBL3 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the lower state group. Furthermore, the control means is configured to apply the fourth single neighbor bit line bias VBL4 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the higher state group. The single neighbor bit line biases VBL!, VBL2, VBL3, and VBL4 can be trimmable or adjustable parameters.

As discussed above and with reference back to FIG. 10, for example, the plurality of data states includes, in increasing magnitude of the threshold voltage, an erased state, a first higher data state and a second higher data state and a third higher data state and a fourth higher data state and a fifth higher data state and a sixth higher data state and a seventh higher data state (e.g., the erased state and A, B, C, D, E, F and G data states of FIG. 10). So, according to an aspect, the lower state group includes the memory cells associated with the erased state and the first higher data state and the second higher data state and the third higher data state and the fourth higher data state (e.g., the erased state and A, B, C, D data states of FIG. 10). The higher state group includes the memory cells associated with the fifth higher data state and the sixth higher data state and the seventh higher data state (e.g., the E, F and G data states of FIG. 10).

Referring back to FIGS. 6B, 6D, and 8C, for example, the plurality of word lines and a plurality of dielectric layers extend horizontally and overlay one another in an alternating fashion in a stack. The memory holes extend vertically through the stack. The memory cells are connected in series between a drain-side select gate SGD transistor (e.g., SGD transistors 680 and 681 of FIG. 6B) on a drain-side of each of the memory holes and a source-side select gate SGS transistor (e.g., at SGS0 and SGS1 layers of FIG. 6B) on a source-side of each of the memory holes. The drain-side select gate SGD transistor of each of the memory holes is connected to one of the plurality of bit lines (e.g., BL0 of FIG. 6B) and the source-side select gate SGS transistor of each of the memory holes is connected to a source line (e.g., source line 109 of FIG. 8C). So, according to an aspect, the plurality of word lines includes a first neighboring word line WLn+1 (e.g., WLL2 of FIG. 6B) immediately adjacent to and disposed vertically above each of the selected ones of the plurality of word lines (e.g., WLL1 of FIG. 6B) in the stack and a second neighboring word line WLn−1 (e.g., WLL0 of FIG. 6B) is immediately adjacent to and disposed vertically below each of the selected ones of the plurality of word lines in the stack. According to an aspect of the disclosure, the at least one neighboring word line only includes the second neighboring word line WLn−1. Nevertheless, it should be understood that the at least one neighboring word line could alternatively include the first neighboring word line WLn+1. So, the bit line compensation voltage for the selected word line WLn program verify depends on the second neighboring word line WLn−1 cell data state when doing the selected word line WLn verify. Taking triple-level cell (TLC) programming as an example, when doing the selected word line WLn program and verify, the data state of each cell in the second neighboring word line WLn−1 is known (since in normal order programming, the second neighboring word line WLn−1 is programmed before the selected word line WLn). When doing the selected word line WLn program and verify, the target data state of each memory cell connected to the selected word line WLn are also known based on the selected word line WLn data pattern.

FIG. 15 is a chart showing example bit line biases for a selection of data states for the lower state group and the higher state group as described above and various possible cases of comparisons between the data state groups of the memory cells of the first set and the second set using the data state of only the second neighboring word line. As shown, in case (1), if a memory cell connected to the selected word line WLn needs to be programmed to a lower state (i.e., one of the plurality of data states of the lower state group), and its corresponding neighbor cell connected to the second neighboring word line WLn−1 is a lower state, then use the first single neighbor bit line bias VBL1 for the memory cell when doing the program verify or verify operation for the selected word line WLn. In case (2), if a memory cell connected to the selected word line WLn need to be programmed to a lower state, and its corresponding neighbor cell connected to the second neighboring word line WLn−1 is programmed to a higher state (i.e., one of the plurality of data states of the higher state group), then use the second single neighbor bit line bias VBL2 for the memory cell when doing the program verify or verify operation for the selected word line WLn. In case (3), if a memory cell connected to the selected word line WLn needs to be programmed to a higher state, and its corresponding neighbor cell connected to the second neighboring word line WLn−1 is lower state, then use the third single neighbor bit line bias VBL3 for the memory cell when doing the program verify or verify operation for the selected word line WLn. In case (4), if a memory cell connected to the selected word line WLn needs to be programmed to a higher state, and its corresponding neighbor cell connected to the second neighboring word line WLn−1 is higher state, then use the fourth single neighbor bit line bias VBL4 for the memory cell when doing the program verify or verify operation for the selected word line WLn.

FIG. 16 is an example timing chart of various voltages applied to the bit lines, word lines, selected drain-side select gate transistor, unselected drain-side transistor select gate, and source-side select gate transistor of the memory apparatus during the verify operation described herein. As shown, according to aspects of the disclosure, the control means is further configured, during the verify operation, to apply a read pass voltage VREAD to the first neighboring word line WLn+1 and ones of the plurality of word lines vertically above the first neighboring word line WLn+1. In addition, the control means is configured to apply the read pass voltage VREAD to the second neighboring word line WLn−1 and ones of the plurality of word lines vertically below the second neighboring word line WLn−1. The control means is also configured to sequentially apply each of a plurality of verify voltages VCG_AV–VCG_GV each associated with one of the plurality of data states to the selected word line WLn. The control means applies a select gate voltage VSG to the drain-side select gate transistor of selected ones of the memory holes including the memory cells being verified. The control means is additionally configured to apply the select gate voltage VSG to the source-side select gate transistor of the memory holes. In addition, the control means is configured to apply a steady state voltage VSS to the drain-side select gate transistor of unselected ones of the memory holes including the memory cells not being verified.

According to another aspect, instead of the at least one neighboring word line including only the second neighboring word line WLn−1, the at least one neighboring word line includes the first neighboring word line WLn+1 and the second neighboring word line WLn−1. FIG. 17 is a chart showing example bit line biases for various possible cases of comparisons between the data state groups of the memory cells of the first set and the second set using the data states of both the first and second neighboring word lines. As shown, there are eight possible cases. For example, if a cell connected to the selected word line WLn needs to be programmed to a lower state, and its neighbor WLn−1 cell has been programmed to lower state, and its neighbor WLn+1 cell will be programmed to lower state, then, when doing the selected word line WLn cell verify, the bit line verify voltage will be compensated as VBL_1.

Thus, in more detail and as shown, the plurality of bit line voltage biases can include a first double neighbor bit line bias VBL_1 and a second double neighbor bit line bias VBL_2 and a third double neighbor bit line bias VBL_3 and a fourth double neighbor bit line bias VBL_4 and a fifth double neighbor bit line bias VBL_5 and a sixth double neighbor bit line bias VBL_6 and a seventh double neighbor bit line bias VBL_7 and an eighth double neighbor bit line bias VBL_8, and the control means is further configured to apply the first double neighbor bit line bias VBL_1 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the lower state group. The control means is additionally configured to apply the second double neighbor bit line bias VBL_2 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the lower state group. In addition, the control means is configured to apply the third double neighbor bit line bias VBL_3 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the higher state group. The control means is also configured to apply the fourth double neighbor bit line bias VBL_4 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the lower state group. The control means is additionally configured to apply the fifth double neighbor bit line bias VBL_5 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the higher state group. The control means applies the sixth double neighbor bit line bias VBL_6 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the lower state group. In addition, the control means is configured to apply the seventh double neighbor bit line bias VBL_7 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the higher state group. The control means is also configured to apply the eighth double neighbor bit line bias VBL_8 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the higher state group.

The dynamic bit line voltage compensation during program verify or the verify operation described herein provides numerous advantages. Specifically, the lateral data retention (LDR) is improved between neighbor word lines. Furthermore, the dynamic bit line voltage compensation during program verify described herein results in almost no impact to program time.

FIG. 18 illustrates steps of a method of operating a memory apparatus. As discussed above, the memory apparatus (e.g., memory device 100 of FIG. 1A) includes memory cells (e.g., memory cells MC1, MC2 of FIG. 5B data memory cell MC of FIG. 6D) connected to a plurality of word lines (e.g., WLL10 of FIG. 6D) and disposed in memory holes (e.g., NAND strings NS1 and NS2 of FIG. 6B or NS1 or memory hole 630 of FIG. 6D) each connected to one of a plurality of bit lines (e.g., bit line BL0 of FIG. 6B). The memory cells are configured to retain a threshold voltage corresponding to one of a plurality of data states (e.g., erased state and A. B, C data states of FIG. 9, the erased state and A, B, C, D, E, F and G data states of FIG. 10, the erased state and 1, 2, 3, 4, 5, 6, 7, 8, 9, A, B, C, D, E and F data states of FIG. 11). The method includes the step of 1800 determining ones of the plurality of data states for a first set of the memory cells connected to a selected word line WLn of the plurality of word lines and for a second set of the memory cells connected to at least one neighboring word line of the plurality of word lines adjacent to the selected word line WLn. The method continues by 1802 determining which one of a plurality of state groups the memory cells of the first set and the second set belong according to the ones of the plurality of data states determined for the memory cells of the first set and the second set. The method also includes the step of 1804 determining which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong, the one of the memory cells of the first set used for the comparison being immediately adjacent to one of the memory cells of the second set used for the comparison.

Again, according to an aspect, the plurality of state groups includes the higher state group including ones of the plurality of data states corresponding to the threshold voltage being relatively higher and the lower state group including other ones of the plurality of data states corresponding to the threshold voltage being relatively lower compared to the ones of the plurality of data states of the higher state group. The plurality of bit line voltage biases includes the first single neighbor bit line bias VBL1 and the second single neighbor bit line bias VBL2 and the third single neighbor bit line bias VBL3 and the fourth single neighbor bit line bias VBL4. Thus, the method further includes the step of applying the first single neighbor bit line bias VBL1 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the lower state group. The method continues with the step of applying the second single neighbor bit line bias VBL2 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the higher state group. In addition, the method includes the step of applying the third single neighbor bit line bias VBL3 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the lower state group. The method also includes the step of applying the fourth single neighbor bit line bias VBL4 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the higher state group.

Again, with reference back to FIG. 10, for example, the plurality of data states can include, in increasing magnitude of the threshold voltage, the erased state, the first higher data state and the second higher data state and the third higher data state and the fourth higher data state and the fifth higher data state and the sixth higher data state and the seventh higher data state (e.g., the erased state and A, B, C, D, E, F and G data states of FIG. 10). Thus, the lower state group can include the memory cells associated with the erased state and the first higher data state and the second higher data state and the third higher data state and the fourth higher data state (e.g., the erased state and A, B, C, D data states of FIG. 10). The higher state group may include the memory cells associated with the fifth higher data state and the sixth higher data state and the seventh higher data state (e.g., the E, F and G data states of FIG. 10).

Once again, referring back to FIGS. 6B, 6D, and 8C, for example, the plurality of word lines and the plurality of dielectric layers extend horizontally and overlay one another in an alternating fashion in the stack. The memory holes extend vertically through the stack. The memory cells are connected in series between the drain-side select gate SGD transistor (e.g., SGD transistors 680 and 681 of FIG. 6B) on the drain-side of each of the memory holes and the source-side select gate SGS transistor (e.g., at SGS0 and SGS1 layers of FIG. 6B) on the source-side of each of the memory holes. The drain-side select gate SGD transistor of each of the memory holes is connected to one of the plurality of bit lines (e.g., BL0 of FIG. 6B) and the source-side select gate SGS transistor of each of the memory holes is connected to a source line (e.g., source line 109 of FIG. 8C). The plurality of word lines can include the first neighboring word line WLn+1 (e.g., WLL2 of FIG. 6B) immediately adjacent to and disposed vertically above each of the selected ones of the plurality of word lines (e.g., WLL1 of FIG. 6B) in the stack and the second neighboring word line WLn−1 (e.g., WLL0 of FIG. 6B) is immediately adjacent to and disposed vertically below each of the selected ones of the plurality of word lines in the stack. According to an aspect of the disclosure, the at least one neighboring word line only includes the second neighboring word line WLn−1.

Referring back to FIG. 16 and according to aspects of the disclosure, the method further includes the step, during the verify operation, of applying a read pass voltage VREAD to the first neighboring word line WLn+1 and ones of the plurality of word lines vertically above the first neighboring word line WLn+1 and the second neighboring word line WLn−1 and ones of the plurality of word lines vertically below the second neighboring word line WLn−1. The method additionally includes the step of sequentially applying each of a plurality of verify voltages VCG_AV–VCG_GV each associated with one of the plurality of data states to the selected word line WLn. In addition, the method includes the step of applying a select gate voltage VSG to the drain-side select gate transistor of selected ones of the memory holes including the memory cells being verified. Next, applying the select gate voltage VSG to the source-side select gate transistor of the memory holes. The method also includes the step of applying a steady state voltage VSS to the drain-side select gate transistor of unselected ones of the memory holes including the memory cells not being verified.

According to another aspect, instead of the at least one neighboring word line including only the second neighboring word line WLn−1, the at least one neighboring word line includes the first neighboring word line WLn+1 and the second neighboring word line WLn−1. Thus, as discussed above, the at least one neighboring word line includes the first neighboring word line WLn+1 and the second neighboring word line WLn−1.

Thus, in more detail and referring back to FIG. 17, the plurality of bit line voltage biases can include plurality of bit line voltage biases includes the first double neighbor bit line bias VBL_1 and the second double neighbor bit line bias VBL_2 and the third double neighbor bit line bias VBL_3 and the fourth double neighbor bit line bias VBL_4 and the fifth double neighbor bit line bias VBL_5 and the sixth double neighbor bit line bias VBL_6 and the seventh double neighbor bit line bias VBL_7 and the eighth double neighbor bit line bias VBL_8. So, according to additional aspects, the method further includes the step of applying the first double neighbor bit line bias VBL_1 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the lower state group. In addition, the method includes the step of applying the second double neighbor bit line bias VBL_2 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the lower state group. The next step of the method is applying the third double neighbor bit line bias VBL_3 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the higher state group. The method additionally includes the step of applying the fourth double neighbor bit line bias VBL_4 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the lower state group. The method continues by applying the fifth double neighbor bit line bias VBL_5 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the lower state group and the one of the plurality of data states determined for the one of the memory cells of the second set connected to the second neighboring word line WLn−1 used for the comparison being in the higher state group. Next, applying the sixth double neighbor bit line bias VBL_6 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the lower state group. The method proceeds with the step of applying the seventh double neighbor bit line bias VBL_7 to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the higher state group. The method also includes the step of applying the eighth double neighbor bit line bias VBL_8 to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line WLn+1 used for the comparison being in the higher state group and the one of the plurality of data states determined for the one of the memory cells of the second set connected to the second neighboring word line WLn−1 used for the comparison being in the higher state group.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory apparatus, comprising:
   memory cells connected to a plurality of word lines and disposed in memory holes each connected to one of a plurality of bit lines, the memory cells configured to retain a threshold voltage corresponding to one of a plurality of data states; and
   a control means coupled to the plurality of word lines and the plurality of bit lines and configured to:
      determine ones of the plurality of data states for a first set of the memory cells connected to a selected word line of the plurality of word lines and for a second set of the memory cells connected to at least one neighboring word line of the plurality of word lines adjacent to the selected word line,
      determine which one of a plurality of state groups the memory cells of the first set and the second set belong according to the ones of the plurality of data states determined for the memory cells of the first set and the second set, and
      determine which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong, the one of the memory cells of the first set used for the comparison being immediately adjacent to one of the memory cells of the second set used for the comparison.

2. The memory apparatus as set forth in claim 1, wherein the plurality of state groups includes a higher state group including ones of the plurality of data states corresponding to the threshold voltage being relatively higher and a lower state group including other ones of the plurality of data states corresponding to the threshold voltage being relatively lower compared to the ones of the plurality of data states of the higher state group, the plurality of bit line voltage biases includes a first single neighbor bit line bias and a second single neighbor bit line bias and a third single neighbor bit line bias and a fourth single neighbor bit line bias, and the control means is further configured to:
   apply the first single neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the lower state group;
   apply the second single neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the higher state group;
   apply the third single neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the lower state group; and
   apply the fourth single neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the higher state group.

3. The memory apparatus as set forth in claim 2, wherein the plurality of data states includes, in increasing magnitude of the threshold voltage, an erased state, a first higher data state and a second higher data state and a third higher data state and a fourth higher data state and a fifth higher data state and a sixth higher data state and a seventh higher data state, and the lower state group includes the memory cells associated with the erased state and the first higher data state and the second higher data state and the third higher data state and the fourth higher data state and the higher state group includes the memory cells associated with the fifth higher data state and the sixth higher data state and the seventh higher data state.

4. The memory apparatus as set forth in claim 1, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, the plurality of word lines includes a first neighboring word line immediately adjacent to and disposed vertically above the selected word line in the stack and a second neighboring word line immediately adjacent to and disposed vertically below the selected word line in the stack, and the at least one neighboring word line includes the second neighboring word line.

5. The memory apparatus as set forth in claim 4, wherein the control means is further configured, during the verify operation, to:

apply a read pass voltage to the first neighboring word line and ones of the plurality of word lines vertically above the first neighboring word line and the second neighboring word line and ones of the plurality of word lines vertically below the second neighboring word line;

sequentially apply each of a plurality of verify voltages each associated with one of the plurality of data states to the selected word line;

apply a select gate voltage to the drain-side select gate transistor of selected ones of the memory holes including the memory cells being verified;

apply the select gate voltage to the source-side select gate transistor of the memory holes; and apply a steady state voltage to the drain-side select gate transistor of unselected ones of the memory holes including the memory cells not being verified.

6. The memory apparatus as set forth in claim 1, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, the plurality of word lines includes a first neighboring word line immediately adjacent to and disposed vertically above the selected word line in the stack and a second neighboring word line immediately adjacent to and disposed vertically below the selected word line in the stack, and the at least one neighboring word line includes the first neighboring word line and the second neighboring word line.

7. The memory apparatus as set forth in claim 6, wherein the plurality of state groups includes a higher state group including ones of the plurality of data states corresponding to the threshold voltage being relatively higher and a lower state group including other ones of the plurality of data states corresponding to the threshold voltage being relatively lower compared to the ones of the plurality of data states of the higher state group, the plurality of bit line voltage biases includes a first double neighbor bit line bias and a second double neighbor bit line bias and a third double neighbor bit line bias and a fourth double neighbor bit line bias and a fifth double neighbor bit line bias and a sixth double neighbor bit line bias and a seventh double neighbor bit line bias and an eighth double neighbor bit line bias, and the control means is further configured to:

apply the first double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the lower state group;

apply the second double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the lower state group;

apply the third double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the higher state group;

apply the fourth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the lower state group;

apply the fifth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the higher state group;

apply the sixth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the lower state group;

apply the seventh double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the higher state group; and apply the eighth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the higher state group.

8. A controller in communication with a memory apparatus including memory cells connected to a plurality of word lines and disposed in memory holes each connected to one of a plurality of bit lines, the memory cells configured to retain a threshold voltage corresponding to one of a plurality of data states, the controller configured to:

instruct the memory apparatus to determine ones of the plurality of data states for a first set of the memory cells connected to a selected word line of the plurality of word lines and for a second set of the memory cells connected to at least one neighboring word line of the plurality of word lines adjacent to the selected word line;

determine which one of a plurality of state groups the memory cells of the first set and the second set belong according to the ones of the plurality of data states determined for the memory cells of the first set and the second set; and determine which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong, the one of the memory cells of the first set used for the comparison being immediately adjacent to one of the memory cells of the second set used for the comparison.

9. The controller as set forth in claim 8, wherein the plurality of state groups includes a higher state group including ones of the plurality of data states corresponding to the threshold voltage being relatively higher and a lower state group including other ones of the plurality of data states corresponding to the threshold voltage being relatively lower compared to the ones of the plurality of data states of the higher state group, the plurality of bit line voltage biases includes a first single neighbor bit line bias and a second single neighbor bit line bias and a third single neighbor bit line bias and a fourth single neighbor bit line bias, and the controller is further configured to:

instruct the memory apparatus to apply the first single neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the lower state group;

instruct the memory apparatus to apply the second single neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the higher state group;

instruct the memory apparatus to apply the third single neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the lower state group; and instruct the memory apparatus to apply the fourth single neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the higher state group.

10. The controller as set forth in claim 9, wherein the plurality of data states includes, in increasing magnitude of the threshold voltage, an erased state, a first higher data state and a second higher data state and a third higher data state and a fourth higher data state and a fifth higher data state and a sixth higher data state and a seventh higher data state, and the lower state group includes the memory cells associated with the erased state and the first higher data state and the second higher data state and the third higher data state and the fourth higher data state and the higher state group includes the memory cells associated with the fifth higher data state and the sixth higher data state and the seventh higher data state.

11. The controller as set forth in claim 8, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, the plurality of word lines includes a first neighboring word line immediately adjacent to and disposed vertically above the selected word line in the stack and a second neighboring word line immediately adjacent to and disposed vertically below the selected word line in the stack, and the at least one neighboring word line includes the second neighboring word line.

12. The controller as set forth in claim 11, wherein the controller is further configured, during the verify operation, to:

instruct the memory apparatus to apply a read pass voltage to the first neighboring word line and ones of the plurality of word lines vertically above the first neighboring word line and the second neighboring word line and ones of the plurality of word lines vertically below the second neighboring word line;

instruct the memory apparatus to sequentially apply each of a plurality of verify voltages each associated with one of the plurality of data states to the selected word line;

instruct the memory apparatus to apply a select gate voltage to the drain-side select gate transistor of selected ones of the memory holes including the memory cells being verified;

instruct the memory apparatus to apply the select gate voltage to the source-side select gate transistor of the memory holes; and instruct the memory apparatus to apply a steady state voltage to the drain-side select gate transistor of unselected ones of the memory holes including the memory cells not being verified.

13. The controller as set forth in claim 8, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, the plurality of word lines includes a first neighboring word line immediately adjacent to and disposed vertically above the selected word line in the stack and a second neighboring word line immediately adjacent to and disposed vertically below the selected word line in the stack, and the at least one neighboring word line includes the first neighboring word line and the second neighboring word line.

14. A method of operating a memory apparatus including memory cells connected to a plurality of word lines and disposed in memory holes each connected to one of a plurality of bit lines, the memory cells configured to retain a threshold voltage corresponding to one of a plurality of data states, the method comprising the steps of:

determining ones of the plurality of data states for a first set of the memory cells connected to a selected word line of the plurality of word lines and for a second set of the memory cells connected to at least one neighboring word line of the plurality of word lines adjacent to the selected word line;

determining which one of a plurality of state groups the memory cells of the first set and the second set belong according to the ones of the plurality of data states determined for the memory cells of the first set and the second set; and determining which one of a plurality of bit line voltage biases to be applied to ones of the plurality of bit lines coupled to each one of the memory cells of the first set during a verify operation based on a comparison of the one of the plurality of state groups each one of the memory cells of the first set and each one of the memory cells of the second set belong, the one of the memory cells of the first set used for the comparison being immediately adjacent to one of the memory cells of the second set used for the comparison.

15. The method as set forth in claim 14, wherein the plurality of state groups includes a higher state group including ones of the plurality of data states corresponding to the threshold voltage being relatively higher and a lower state group including other ones of the plurality of data states corresponding to the threshold voltage being relatively lower compared to the ones of the plurality of data states of the higher state group, the plurality of bit line voltage biases includes a first single neighbor bit line bias and a second single neighbor bit line bias and a third single neighbor bit line bias and a fourth single neighbor bit line bias, and the method further includes the steps of:

applying the first single neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the lower state group;

applying the second single neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set used for the comparison being in the higher state group;

applying the third single neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the lower state group; and
applying the fourth single neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set used for the comparison being in the higher state group.

16. The method as set forth in claim 15, wherein the plurality of data states includes, in increasing magnitude of the threshold voltage, an erased state, a first higher data state and a second higher data state and a third higher data state and a fourth higher data state and a fifth higher data state and a sixth higher data state and a seventh higher data state, and the lower state group includes the memory cells associated with the erased state and the first higher data state and the second higher data state and the third higher data state and the fourth higher data state and the higher state group includes the memory cells associated with the fifth higher data state and the sixth higher data state and the seventh higher data state.

17. The method as set forth in claim 14, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, the plurality of word lines includes a first neighboring word line immediately adjacent to and disposed vertically above the selected word line in the stack and a second neighboring word line immediately adjacent to and disposed vertically below the selected word line in the stack, and the at least one neighboring word line includes the second neighboring word line.

18. The method as set forth in claim 17, wherein the method further includes the steps, during the verify operation, of:
applying a read pass voltage to the first neighboring word line and ones of the plurality of word lines vertically above the first neighboring word line and the second neighboring word line and ones of the plurality of word lines vertically below the second neighboring word line;
sequentially applying each of a plurality of verify voltages each associated with one of the plurality of data states to the selected word line;
applying a select gate voltage to the drain-side select gate transistor of selected ones of the memory holes including the memory cells being verified;
applying the select gate voltage to the source-side select gate transistor of the memory holes; and
applying a steady state voltage to the drain-side select gate transistor of unselected ones of the memory holes including the memory cells not being verified.

19. The method as set forth in claim 14, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, the plurality of word lines includes a first neighboring word line immediately adjacent to and disposed vertically above the selected word line in the stack and a second neighboring word line immediately adjacent to and disposed vertically below the selected word line in the stack, and the at least one neighboring word line includes the first neighboring word line and the second neighboring word line.

20. The method as set forth in claim 19, wherein the plurality of state groups includes a higher state group including ones of the plurality of data states corresponding to the threshold voltage being relatively higher and a lower state group including other ones of the plurality of data states corresponding to the threshold voltage being relatively lower compared to the ones of the plurality of data states of the higher state group, the plurality of bit line voltage biases includes a first double neighbor bit line bias and a second double neighbor bit line bias and a third double neighbor bit line bias and a fourth double neighbor bit line bias and a fifth double neighbor bit line bias and a sixth double neighbor bit line bias and a seventh double neighbor bit line bias and an eighth double neighbor bit line bias, and the method further includes the steps of:
applying the first double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the lower state group;
applying the second double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the lower state group;
applying the third double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the higher state group;

applying the fourth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the lower state group;

applying the fifth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the lower state group and the one of the plurality of data states determined for the one of the memory cells of the second set connected to the second neighboring word line used for the comparison being in the higher state group;

applying the sixth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the lower state group;

applying the seventh double neighbor bit line bias to the ones of the plurality of bit lines coupled to each one of the memory cells of the first set during the verify operation in response to the one of the plurality of data states targeted for the one of the memory cells of the first set used for the comparison being in the lower state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the higher state group; and applying the eighth double neighbor bit line bias to the ones of the plurality of bit lines coupled to each one of the memory cells of the first set during the verify operation in response to the one of the plurality of data states targeted for the one of the memory cells of the first set used for the comparison being in the higher state group and the one of the plurality of data states determined for the one of the memory cells of the second set connected to the first neighboring word line used for the comparison being in the higher state group and the one of the plurality of data states determined for the one of the memory cells of the second set connected to the second neighboring word line used for the comparison being in the higher state group.

* * * * *